United States Patent
Chu et al.

(10) Patent No.: US 12,009,269 B2
(45) Date of Patent: Jun. 11, 2024

(54) VIRTUAL METROLOGY FOR FEATURE PROFILE PREDICTION IN THE PRODUCTION OF MEMORY DEVICES

(71) Applicant: SanDisk Technologies LLC, Addison, TX (US)

(72) Inventors: Cheng-Chung Chu, Milpitas, CA (US); Masaaki Higashitani, Cupertino, CA (US); Yusuke Ikawa, Yokohama (JP); Seyyed Ehsan Esfahani Rashidi, San Jose, CA (US); Kei Samura, Yokohama (JP); Tsuyoshi Sendoda, Kuwana (JP); Yanli Zhang, San Jose, CA (US)

(73) Assignee: SanDisk Technologies LLC, Austin, TX (US)

( * ) Notice: Subject to any disclaimer, the term of this patent is extended or adjusted under 35 U.S.C. 154(b) by 317 days.

(21) Appl. No.: 17/725,695

(22) Filed: Apr. 21, 2022

(65) Prior Publication Data
US 2022/0415718 A1    Dec. 29, 2022

Related U.S. Application Data

(63) Continuation-in-part of application No. 17/360,573, filed on Jun. 28, 2021.

(51) Int. Cl.
*H01L 21/66*    (2006.01)
*H01L 27/11578*    (2017.01)
(Continued)

(52) U.S. Cl.
CPC .............. *H01L 22/14* (2013.01); *H01L 22/12* (2013.01); *H01L 22/26* (2013.01); *H10B 43/20* (2023.02); *H10B 43/10* (2023.02)

(58) Field of Classification Search
None
See application file for complete search history.

(56) References Cited

U.S. PATENT DOCUMENTS

| 3,751,647 A | 8/1973 | Maeder et al. |
| 7,949,618 B2 | 5/2011 | Bischoff et al. |
| (Continued) | | |

FOREIGN PATENT DOCUMENTS

| CN | 112534246 A | 3/2021 |
| DE | 102023205594 A1 | 12/2023 |

OTHER PUBLICATIONS

Esposito, Tony, et al., "Automatic Defect Classification: A Productivity Improvement Tool," Yield Management Solutions, Autumn 1998, 5 pages.

(Continued)

*Primary Examiner* — Jermele M Hollington
(74) *Attorney, Agent, or Firm* — Vierra Magen Marcus LLP

(57) ABSTRACT

To provide more test data during the manufacture of non-volatile memories and other integrated circuits, machine learning is used to generate virtual test values. Virtual test results are interpolated for one set of tests for devices on which the test is not performed based on correlations with other sets of tests. In one example, machine learning determines a correlation study between bad block values determined at die sort and photo-limited yield (PLY) values determined inline during processing. The correlation can be applied to interpolate virtual inline PLY data for all of the memory dies, allowing for more rapid feedback on the processing parameters for manufacturing the memory dies and making the manufacturing process more efficient and accurate. In another set of embodiments, the machine learning is used to extrapolate limited metrology (e.g., critical dimension) test data to all of the memory die through interpolated virtual metrology data values.

20 Claims, 26 Drawing Sheets

(51) Int. Cl.
*H10B 43/20* (2023.01)
*H10B 43/10* (2023.01)

(56) References Cited

U.S. PATENT DOCUMENTS

| | | |
|---|---|---|
| 10,795,346 B2 | 10/2020 | Yennie et al. |
| 10,921,782 B2 | 2/2021 | Mehr et al. |
| 10,929,586 B2 * | 2/2021 | Banna .................... G06N 5/04 |
| 11,947,266 B2 * | 4/2024 | Brantjes ............. G03F 7/70633 |
| 2008/0319568 A1 | 12/2008 | Berndlmaier et al. |
| 2018/0348290 A1 | 12/2018 | Teplinsky |
| 2022/0236647 A1 * | 7/2022 | Hauptmann ........ G03F 7/70508 |
| 2022/0413036 A1 * | 12/2022 | Ikawa ............. G01R 31/31835 |
| 2022/0415718 A1 | 12/2022 | Chu |
| 2023/0054342 A1 | 2/2023 | Sendoda |
| 2023/0142936 A1 | 5/2023 | Sendoda |

OTHER PUBLICATIONS

U.S. Appl. No. 17/360,573, filed Jun. 28, 2021.
U.S. Appl. No. 17/979,142 filed Nov. 2, 2022.
Restriction Requirement dated Sep. 19, 2023, U.S. Appl. No. 17/360,573, filed Jun. 28, 2021.
Response to Restriction dated Oct. 30, 2023, U.S. Appl. No. 17/360,573, filed Jun. 28, 2021.
Non-final Office Action dated Feb. 14, 2024, U.S. Appl. No. 17/360,573, filed Jun. 28, 2021.

* cited by examiner

VIRTUAL METROLOGY FOR FEATURE PROFILE PREDICTION IN THE PRODUCTION OF MEMORY DEVICES

CLAIM OF PRIORITY

The present application is a Continuation-in-Part of U.S. patent application Ser. No. 17/360,573, entitled "Virtual Quality Control Interpolation and Process Feedback in the Production of Memory Devices" by Ikawa et al., filed Jun. 28, 2021, which is hereby incorporated by reference in its entireties.

BACKGROUND

In the course of manufacturing of memory devices or, more generally other integrated circuits and electronic devices, many testing and inspection operations are typically performed. The testing can occur at many stages during manufacturing and also afterwards to determine defects and process variations. The test results can be used to determine defective, or potentially defective, devices, sort devices according to their characteristics, or to adjust processing parameters. The more testing that is done, the more data that is available for quality control; however, testing can be expensive and time consuming, and in some cases involves preparing of test sample in ways that make them subsequently unusable. Because of this, the number of test samples and the types of tests that can be performed are limited.

DETAILED DESCRIPTION

In the course of manufacturing non-volatile memory circuits or other integrated circuits, testing is performed at many stages during manufacturing and afterwards to determine defects and process variations. The testing results can be used to determine defective, or potentially defective, devices, sort devices according to their characteristics, or to adjust processing parameters. Although testing a higher proportion of the devices can lead to more accurate and representative test data, testing is expensive in terms of both time and cost and can also reduce yields, as some tests render the samples subsequently unusable. To improve on this situation, the following introduces the use of machine learning to generate virtual values for one set of tests, by interpolating the virtual test results for devices on which the test is not performed, based on correlations with other sets of tests.

One set of embodiments uses an example of sacrificial layer wet-etch photo inspection, or photo-limited yield (PLY), data for a machine learning correlation study between bad block values or other circuit characteristics (e.g., resistance, current, threshold voltages) determined at die sort and PLY values determined inline during processing. The correlation can be applied to interpolate virtual inline PLY data for all of the memory dies, allowing for more rapid feedback on the processing parameters for manufacturing the memory dies and making the manufacturing process more efficient and accurate. In another set of embodiments, the machine learning is used to extrapolate limited critical dimension or other metrology test data to all of the memory dies through interpolated virtual metrology test values. In further embodiments, virtual metrology is used to interpolate memory hole profiles in a three dimensional (3D) NAND memory structure based on the electrical properties (e.g., RC values) of the word lines of the layers of the memory structure.

Figure 1:
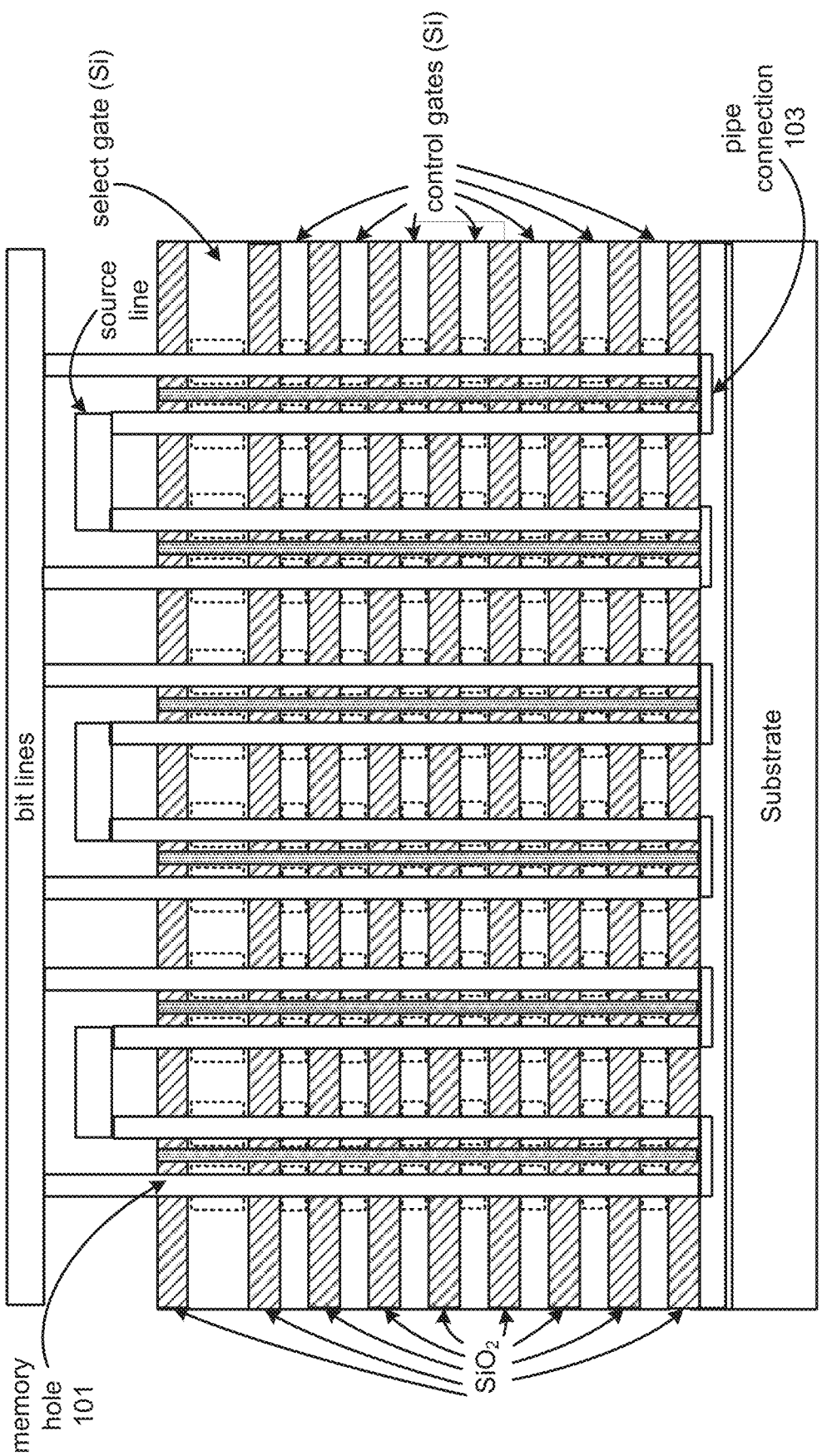
FIG. 1 is a drawing of a three dimensional non-volatile memory device of the BiCS type.

To provide some context for the primary example of a non-volatile integrated memory circuit to which the techniques presented here are applied in the following discussion, FIG. 1 is a drawing of a three dimensional non-volatile memory device of the Bit Cost Scalable (BiCS) type. In FIG. 1, a number of memory holes, such as marked at 101, extend down from bit lines to a substrate, passing through silicon layers (Si) corresponding to the word lines that form the control gates layers surrounding the memory holes. In between the control gate layers are dielectric layers (e.g., $SiO_2$). The BiCS structure of FIG. 1 is of the U type, where a memory hole extends downward to a pipe connection, such as marked at 103, in the substrate that connects it to another memory hole that then extends upward to a source line. Together, the two sections form a NAND string between a bit line and a source line, where a select gate line is formed on the ends of the NAND strings between the memory cells and the bit lines on one end and the source lines on the other end. The memory cells are formed in the memory holes in the regions where the holes pass through the control gate layers.

In the illustration of FIG. 1, only a few control gate layers are shown and a U-type structure is used. A typical BiCS structure will have many more such layers and will often not use the U-type structure, but will have the source lines connected along the bottom of the memory hole/NAND string at the substrate end, as illustrated in FIG. 2.

Figure 2:
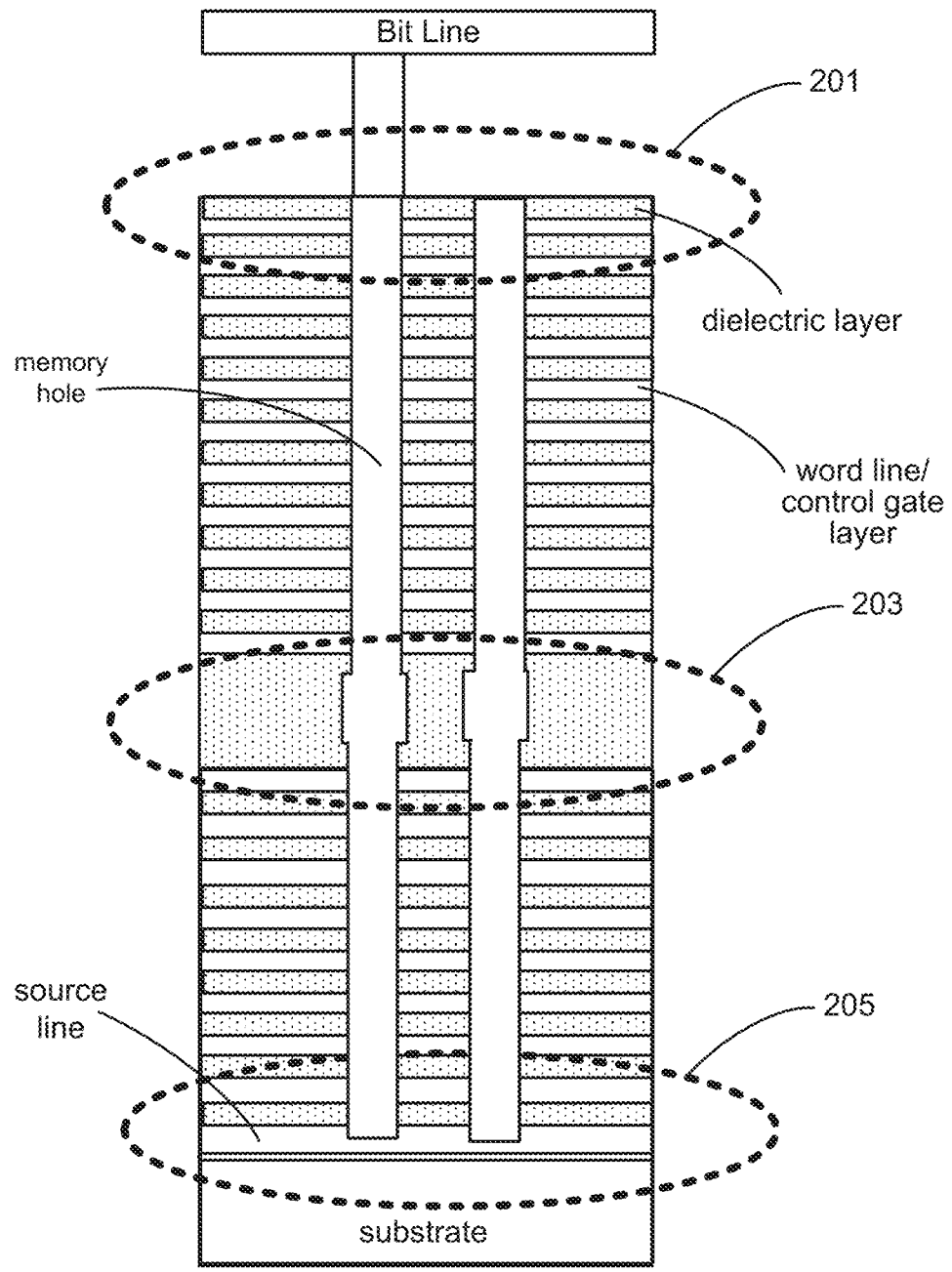
FIG. 2 represents a side view cross-section of a BiCS structure and its memory holes.

FIG. 2 represents a side view cross-section of a (non-U-type) BiCS structure and its memory holes. In the processing to fabricate the structures of FIGS. 1 and 2, a large number of alternating control gate layers and dielectric layers are formed, connected between bit lines at top (top circled region, 201) and a source line at the bottom (bottom circuit region, 205). In the embodiment of FIG. 2, at a central circled region 203 is a joint region that divides the select gates into an upper half and a lower half. The formation of the memory holes through the control gate layers, dielectric layers, and other layers is a delicate and complex processing operation, which can be particularly delicate at the circled regions 201, 203, and 205 of FIG. 2. These regions comprise a bottom, "dimple" region formed under the memory holes in the substrate at the region 205; a central, joint region in 203 in central portion of the memory array structure; and a "shoulder" region at 201, where the memory hole opens up and connects to the bit lines. To form the memory cells, a number of concentric ring-like layers are formed within the memory holes.

Figure 3:
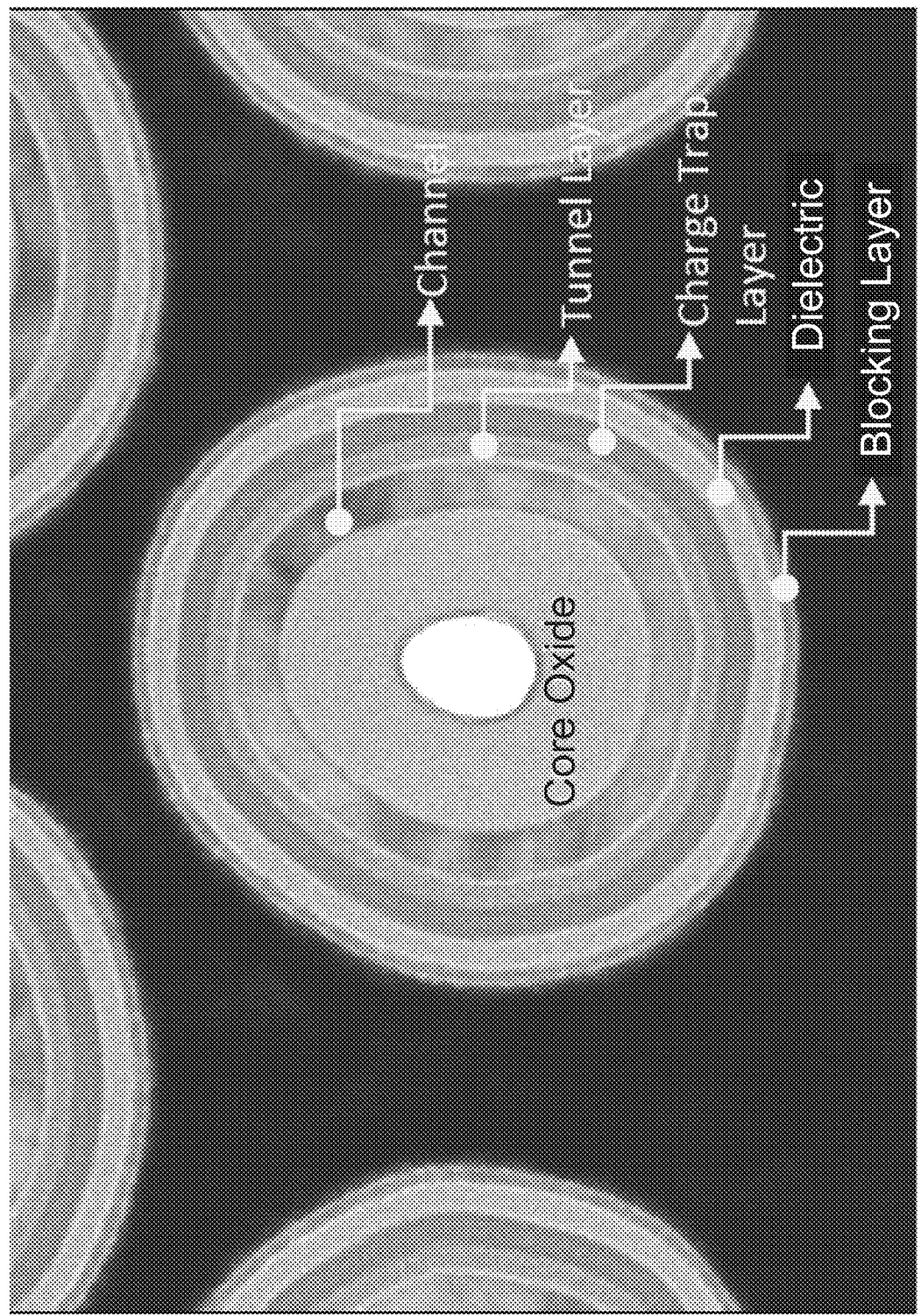
FIG. 3 is the top view of the layers formed within the memory hole to provide the memory cells of the NAND structure.

FIG. 3 is a top view of the layers formed within the memory hole to provide the memory cells of the NAND structure, showing a view from above horizontal cross-section taken at A-A part way down the structure of FIG. 2. The view of FIG. 3 can be prepared from a fully fabricated device that is pared back after processing is complete, or from an intermediate state of processing during the fabrication operation. FIG. 3 illustrates a Metal Oxide Nitride Oxide Silicon (MONOS) of, starting at the outside of the memory hole and working inward for this particular embodiment, a blocking layer followed by a dielectric layer. Next is a charge trap layer, in which the memory device stores electrons to determine the data state of a memory cell. The charge trap layer is separated by a tunnel layer from the channel layer of the NAND string, with an inner core oxide formed inside of the channel layers.

Figure 4:
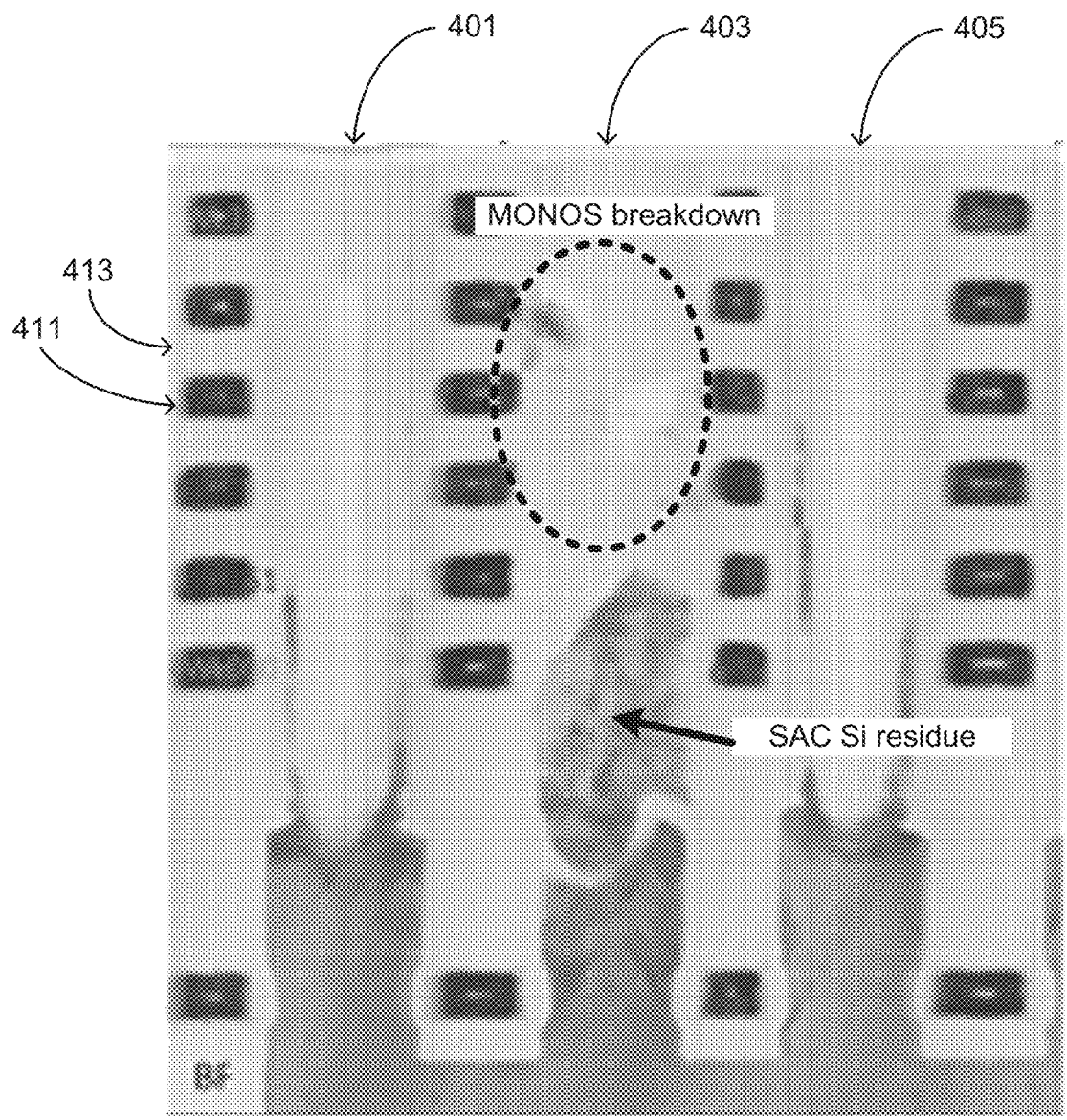
FIG. 4 is a side view of an actual 3D NAND memory device, similar to lower portion of the drawing of FIG. 2, to illustrate some examples of processing problems in the fabrication of such a device.
Figure 5:
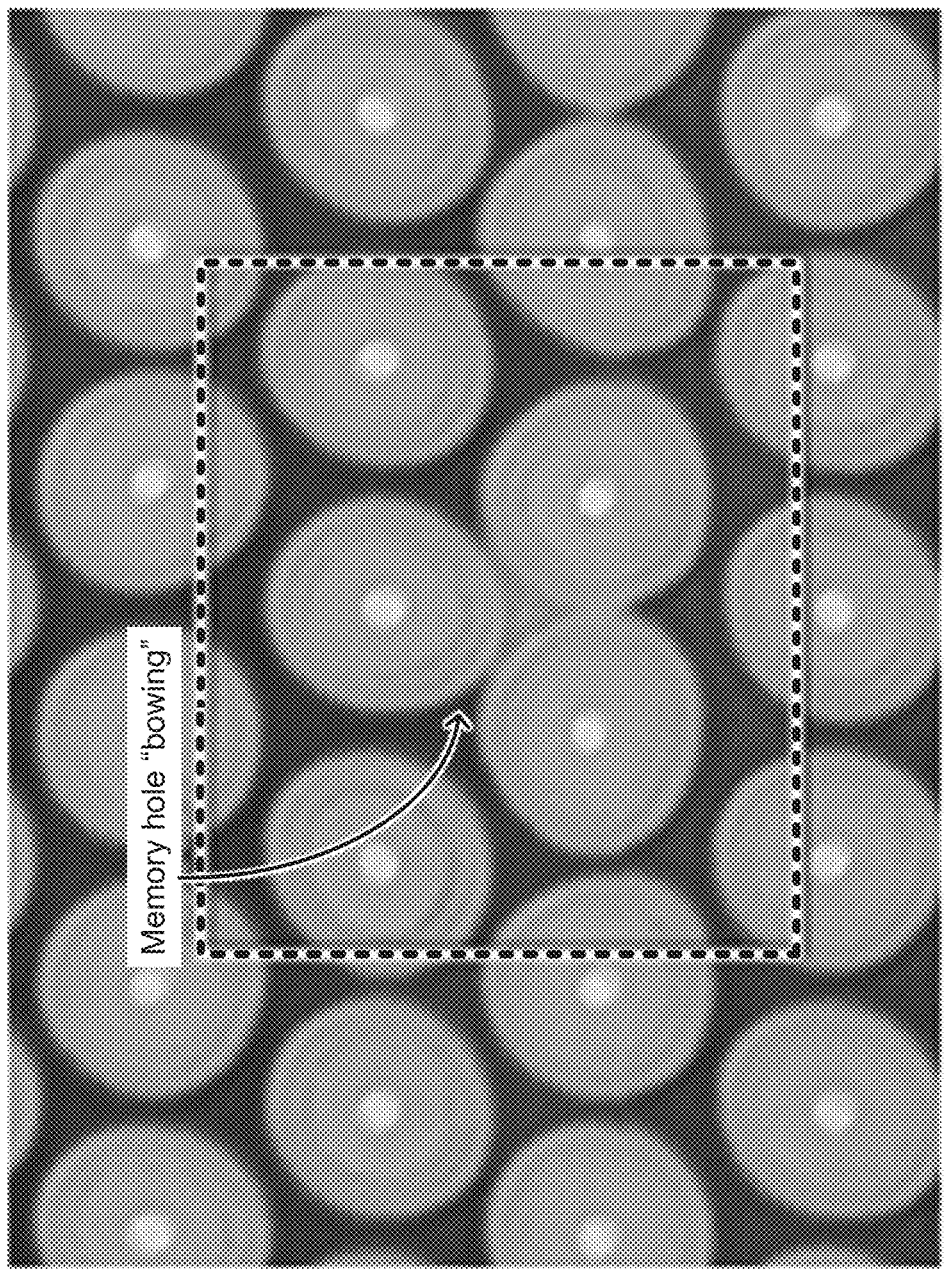
FIG. 5 shows a top view of an actual 3D NAND structure, similar to FIG. 3, but showing more memory hole structures.

In forming such a memory structure, the memory holes and the layers within them are formed to have generally circular cross-sections, with each of the layers meant to have a specified and uniform thickness. Due to process variations, the actual shapes and thicknesses of these layer will vary. Because of this, processing samples can be collected and analyzed to determine the quality of the integrated circuits. As the number of memory holes in a given device is extremely large, and the number of devices produced is also large, visual or photo inspection tests by a person is very labor intensive process and, as a practical matter, only a small percentage of the memory holes on a given device, and only a small number of devices, can be inspected. FIGS. 4 and 5 illustrate some examples of defects that man occur in the fabrication of such complex structures.

FIG. 4 is a side view cross-section image of an actual 3D NAND memory device, similar to lower portion of the drawing of FIG. 2, to illustrate some examples of processing problems in the fabrication of such a device. The view of FIG. 4 shows three memory holes, 401, 403, 405, and several word lines (e.g., 411) separated by dielectric layers (e.g., 413) at an intermediate processing stage, where the alternating word line-dielectric layers have been formed, but the MONOS regions, that serve as a memory film, have not been completed. The middle memory hole 403 has some problems. A first is that, in forming the stack of word line-layers, the memory holes through the layers, and the various lining layers of FIG. 3, at certain stages sacrificial silicon layers are formed with the memory holes as part of the processing process. These sacrificial silicon layers need to be cleaned out of the memory holes so that the desired layers can be formed within the memory holes. The middle memory hole has a sacrificial silicon residue (SAC Si residue) that was not sufficiently cleaned out, so that the MONOS layers of the lower few layers (including any source side select gates for the NAND string) cannot be properly formed and the resultant NAND string will be unusable. Another processing defect illustrated in FIG. 4, as highlighted by the broken oval where vertical layers of the MONOS structure are not properly formed, in which case the memory cells in this region are also unusable.

FIG. 5 shows a top view of an actual 3D NAND structure, similar to FIG. 3, but showing more memory hole structures. More specifically, FIG. 5 illustrates when memory holes "bow", so that they are not evenly spaced and not of circular cross-section resulting in layers of the different memory holes are not well-formed and distinct. As illustrated in the portion of the structure within the broken box outline, the layers of several of the memory holes are not distinct, so that the memory cells of these memory holes are unusable.

Figure 6:
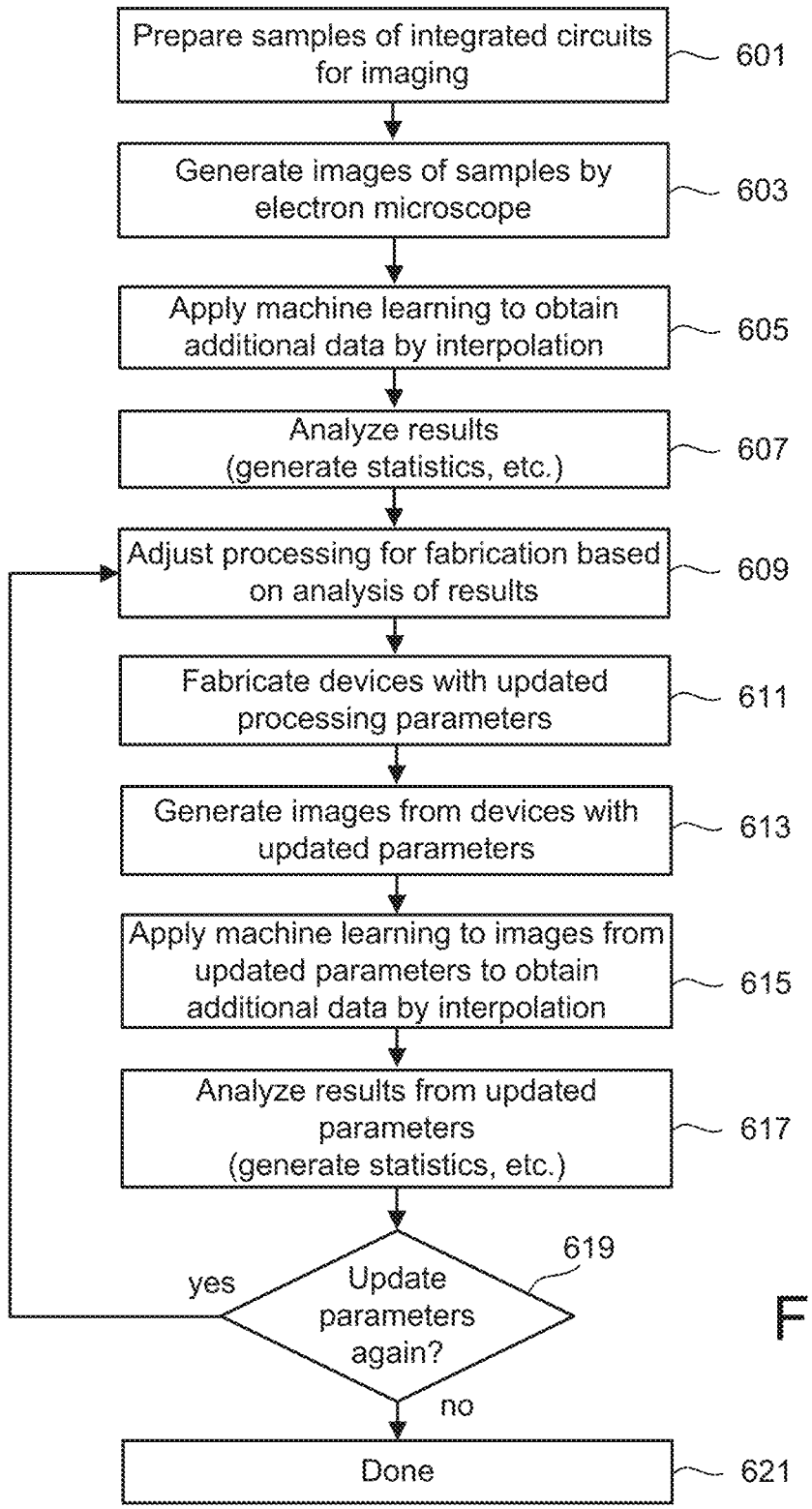
FIG. 6 is a flowchart for one embodiment of the application of test data feedback to the fabrication of a non-volatile memory circuit.

For quality control (QC) purposes, many tests are performed on memory devices, and integrated circuits more generally, at various points in the manufacture to test for defects, including those illustrated with respect to FIGS. 4 and 5. This test information can be used to prevent the shipping of defective parts, but can also be used to adjust the parameters of the fabrication process reduce the number of defects. The more devices that are tested, the more representative that the test data will be and the more accurately that the processing parameters can be updated; however, testing is expensive in terms of time and cost and, for some tests, results in the tested device being unusable. FIG. 6 illustrates the incorporation of test data feedback into the fabrication process, where, as discussed in more detail below, quality control data can be interpolated to provide more extensive test data values.

FIG. 6 is a flowchart for one embodiment of the application of test data feedback, such as related to the memory hole example illustrated with respect to FIGS. 1-5, to the fabrication of a non-volatile memory circuit. This testing can be done as part of a normal test process during fabrication or in response to the occurrence of failed devices as part of failure analysis. The testing can also be done as part of a sorting or binning process (separating devices into lots of good/bad, good/bad/marginal, and or so) or monitor processing, where the results can be used to go back and adjust processing parameters.

Beginning at step 601, samples of an integrated circuit are prepared for imaging. Depending on the embodiment, this can involve the fabrication of samples of the integrated circuit, such as by a sequence of processing steps to build up the circuit on a substrate, or receiving samples of the circuit. Depending on the features of interest, completed samples of the integrated circuit may be used, or the integrated circuits may be at some earlier stage of the fabrication process. For checking on some features, such as the memory hole structures of a three dimensional non-volatile memory circuit, a completed or partially completed circuit can be pared back through one or more layers to reach the layer of interest. The preparing of the integrated circuits for imaging can also include cleaning of the circuits and any needed mounting for generating the images.

At step 603, a set of images are produced, such as by using an electron microscope (a scanning electron microscope, or SEM, for example), on a set of memory chips or other integrated circuits. As noted, to prepare the images, in some embodiments, a finished memory chip can be pared down to a desire level (such as the circled regions in FIG. 2) of the structure, or the device can be only partially completed (such as just the initial stages in order to consider the "dimple" regions where the lower end of the memory hole extends into the substrate). At step 605, additional test data can be generated by applying machine learning to interpolate test data values to extend to additional, or even all, of the devices being fabricated, as in embodiments presented below. For example, as is discussed in more detail below, in order to obtain critical dimension (CD) data for all a group of chips, generalized linear model (GLM), gradient boosting machine (GBM), or other machine learning techniques is performed by measured CD value and its die/sort (D/S) characteristics and, by using the correlation, all virtual CD is interpolated.

At step 607 the expanded test data (both directly measured and interpolated) can be analyzed and used to generate data, including statistics such as expected Circular Memory holes per image vs. Expected Data. At step 609, the statistics can be fed back into the processing operation to adjust the processing for fabricating the integrated circuit based upon the analysis of step 607. At step 611, the devices can then be fabricated with the updated processing parameter(s). For example, the time or parameters (such as temperatures or concentration levels) for various process steps can be changed. Referring back to FIGS. 3 and 5, if, for example, memory holes are too small or too large the time for performing the etch to form the memory holes can be increased or decreased. If some of the layers within a memory hole are too thick or too thin, the time for depositing such a layer can be adjusted. If a layer is too non-circular, the rate at which it is formed could be slowed to obtain more uniformity by, for example, altering the temperature for the processing step or the concentration of the reactants.

The feedback of step 609 can be performed in an iterative process in some embodiments, by including a loop of steps 611, 613, 617, 617, 619, and 621. At step 611, the processing feedback of step 609 is used in a new processing operation to manufacture one or more samples. At 613, electron microscope images can then be generated (similarly to the process of step 603), with additional data being obtain in step 615 (as in step 605). Step 619 can, similarly to step 609, analyze the data and determine whether another iteration is called for: if so, the flow can loop back to step 609; and if not, the process can end at step 621.

In the flow of FIG. 6, the processing steps for the fabrication of the integrated circuits at steps 601 and 611 can be performed by any of the processing methods used in fabricating the integrated circuits being analyzed. The application of machine learning to obtain additional data in steps 605 and 615 can be computationally intensive operations and can be implemented using hardware, firmware, software, or a combination of these. The software used can be stored on one or more processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals. The training phase is typically more computationally intensive and can be performed in the cloud, for example, while inferencing may be performed more locally, such as on computational facilities at the fabrication facility. Examples of the processing units that can be used for the machine learning can include one or more of CPU (central processing unit), GPU (graphic processing unit), TPU (tensorflow processing unit), and NPU (neural processing unit) devices, among others.

The following discussion will mainly be described in the context of the errors described above in FIGS. 4 and 5. As discussed above, FIG. 4 illustrates an example of sacrificial layer wet-etch photo inspection, or photo-limited yield (PLY), related defects for the lower portions (i.e., below region 203 of FIG. 2) of the memory holes, which are often expressed as defective parts per million (DPPM) issues reported in early failure rate (EFR) results. This sort of PLY data can be a key piece of information to detect device failure and to study process improvements from both a yield and a DPPM point of view; but such directly obtained sacrificial layer wet-etch photo inspection PLY data is very limited data since the measurement is not done for all chips and all wafers. As also discussed above, FIG. 5 illustrates upper memory hole (i.e., above region 203 of FIG. 2) bow related DPPM issues reported in early failure rate results, where upper memory hole bow related critical dimension (CD) data can be a key parameter to screen for failure by the cherry picking of samples to study process improvements from both a yield and a DPPM point of view; but, again, upper memory hole CD data is very limited data since the measurement is not done for all chip and all wafers.

Figure 7:
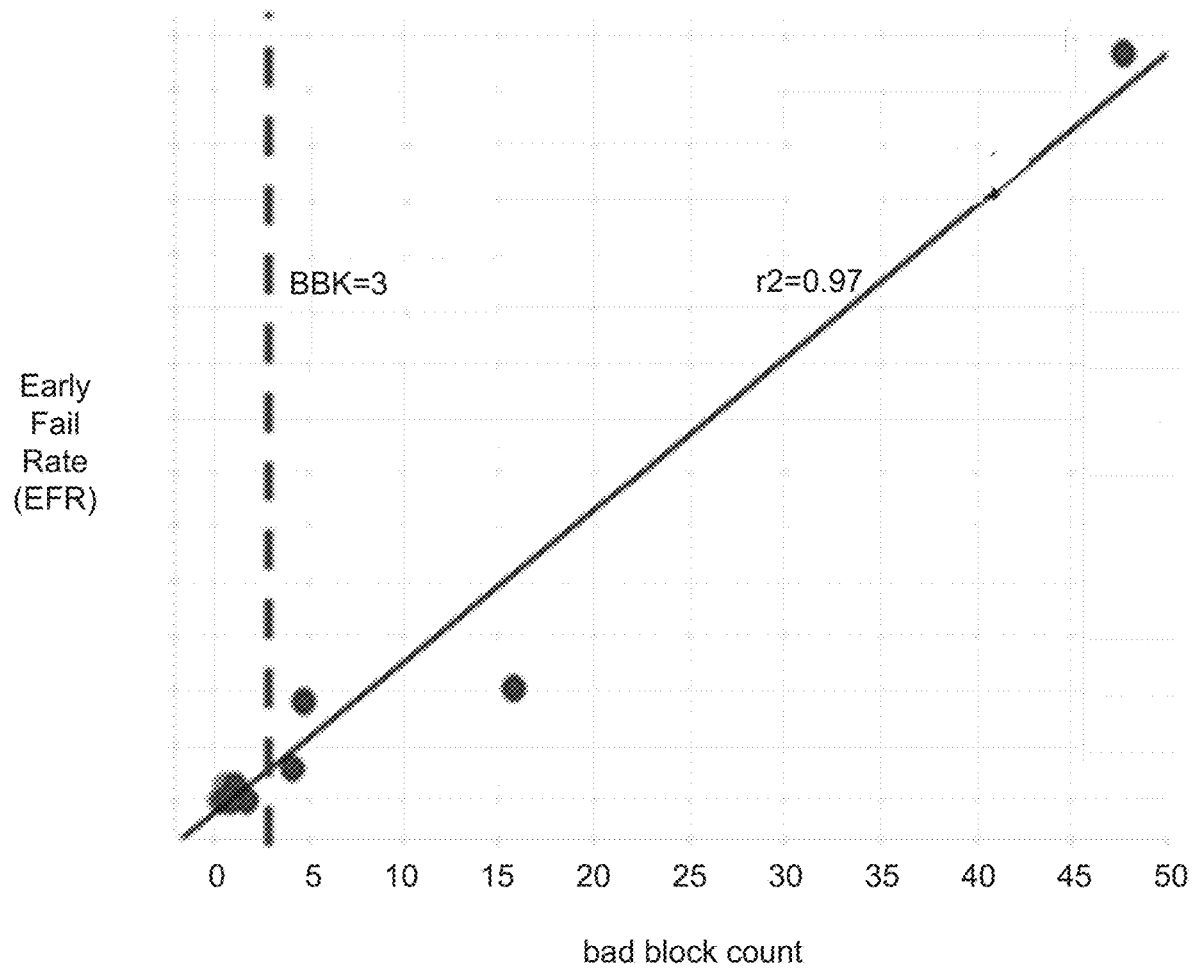
FIG. 7 is a plot illustrating the data relationship between the number of bad blocks on a memory chip versus early failure rate for sampled memory dies.
Figure 8:
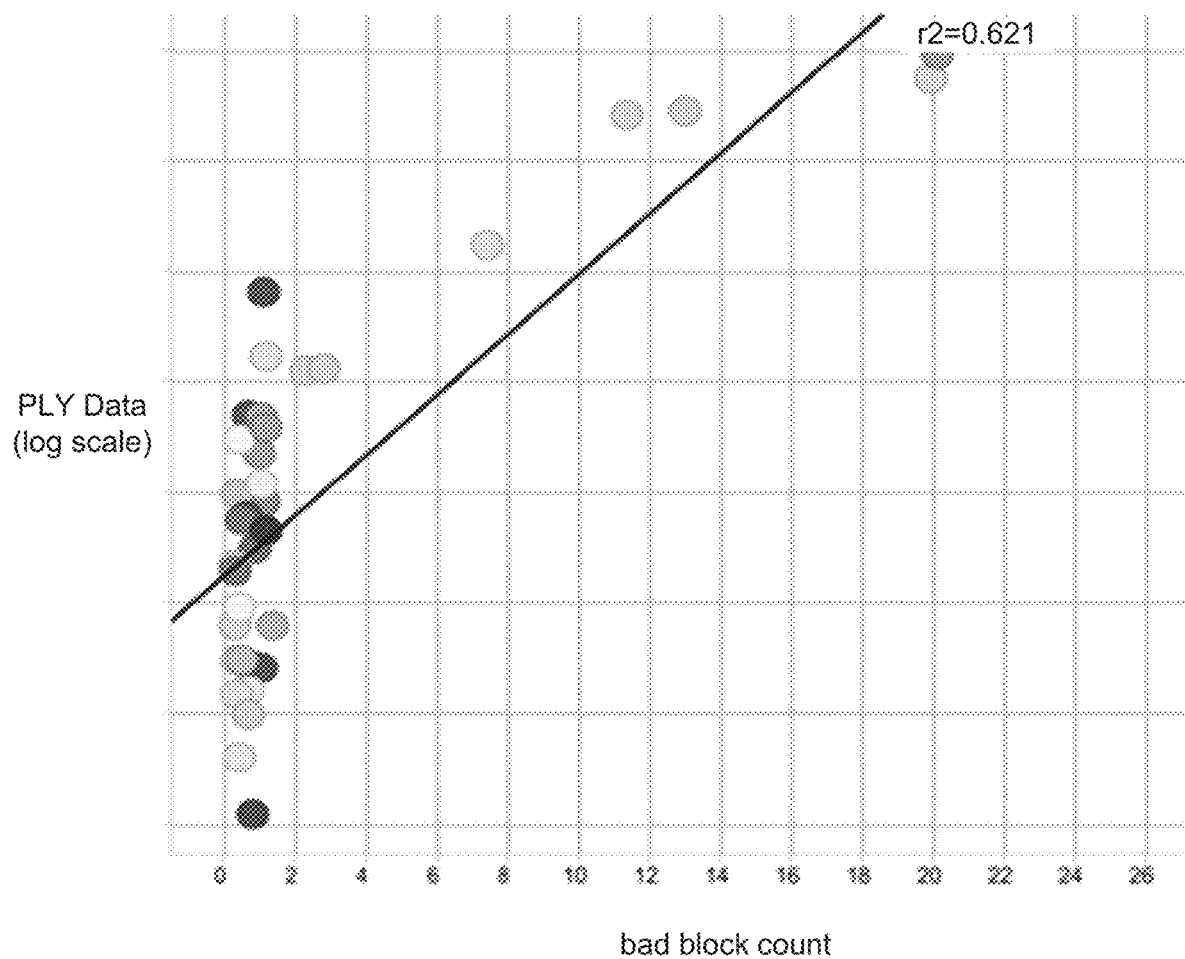
FIG. 8 is a plot illustrating the data relationship between the photo inspection related defect data of a memory chip versus early failure rate for sampled memory dies.

Considering the sacrificial layer wet-etch photo inspection PLY related defect data for the lower portions of the memory holes, for defect determination a bad block index or other circuit characteristics (e.g., resistance, current, threshold voltages) determination can be performed to determine cherry picking criteria, but as illustrated with respect to FIGS. 7 and 8, it can be insufficient to screen for all defects for a sample set due to poor correlation at lower defect regions.

FIG. 7 is a plot illustrating the data relationship between the number of bad blocks on a memory chip versus early failure rate for sampled memory dies, such as can be performed during backend (i.e., post-processing). The vertical axis in FIG. 7 is the early fail rate (EFR) due to defective lower memory holes, such as can be expressed in terms of defective parts per million and the horizontal axis is the number of bad blocks as determined from die sort data, where a linear scale is used on both axes. The correlation between the early fail rate and bad block count is high for the data of FIG. 7 is high, with an $R^2$ value of 0.97, where $R^2$ (or sometimes written r2) is the "coefficient of determination" and represents the proportion of the variance in the dependent variable that is predictable from the independent variable(s) and ranges from 0, for no correlation, to 1, for full correlation. The data of FIG. 7 can be used determine criteria for cherry picking of samples, where, in the example FIG. 7 the criteria of a bad block count (BBK) of BBK=3 is used.

FIG. 8 is a plot illustrating the data relationship between inline photo inspection related defect data of a memory chip versus early failure rate for sampled memory dies. The vertical axis in FIG. 8 is the sacrificial layer wet-etch photo inspection (PLY) determined related defect data for the lower portions of the memory holes in logarithmic scale and the horizontal axis is again the number of bad blocks as determined from die sort data in a linear scale. The vast majority of data points are clumped at low bad block count values, so that there is poor correlation ($R^2=0.621$) between the PLY values and the bad block count based on the limited amount of measured PLY values. To improve upon this situation, the embodiments presented here apply machine learning interpolate the test data in order generate more accurate processing feedback, as represented in FIG. 9.

Figure 9:
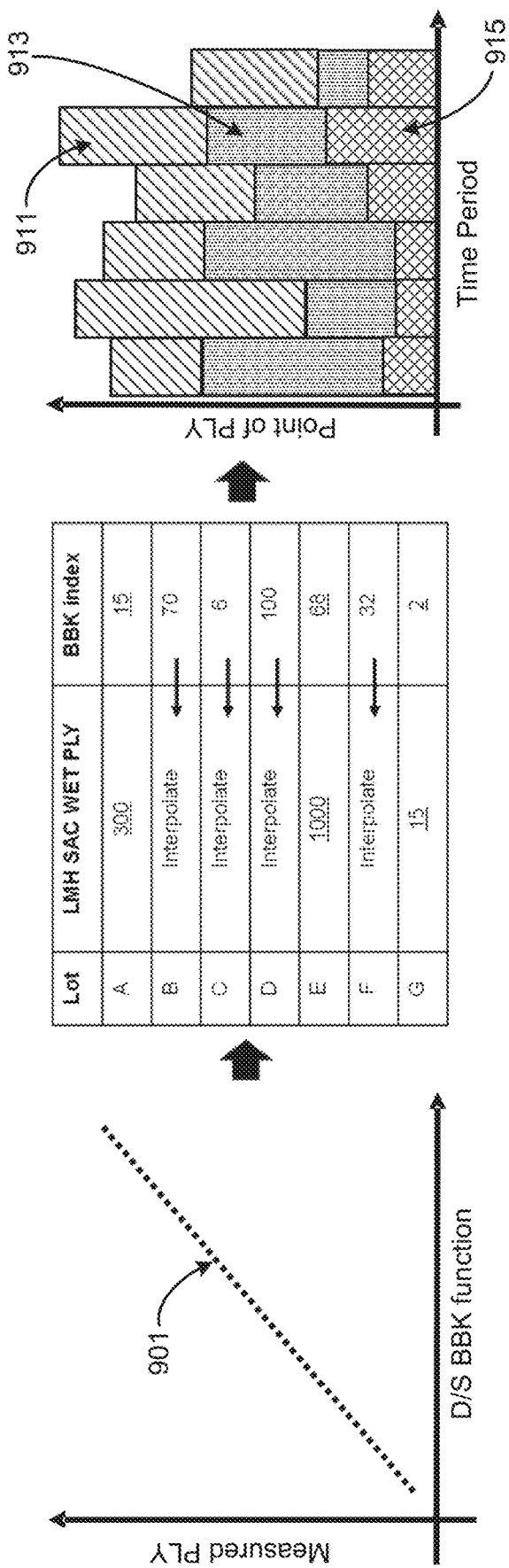
FIG. 9 is a schematic representation of the use of virtual PLY interpolation and process feedback.

FIG. 9 is a schematic representation of the use of virtual PLY interpolation and process feedback. The process begins with performing a detailed correlation study of, in this embodiment, die sort bad block data (D/S BBK) and PLY data by machine learning based on measured values for several lots of memory dies or, more generally, other integrated circuit chips, which is then used to interpolate the PLY data for all of the lots being processed. (In the case of other types of integrated circuitry, a metric other than bad block count can be used.) The result is illustrated at left in FIG. 9, where the measured PLY values (that can again be in a log scale as in FIG. 8) are used to construct the die sort bad block function values as represented by the line 901.

The interpolation of values is illustrated by the table at the center of FIG. 9. The table includes the lover memory hole sacrificial layer wet-etch PLY defect values (LMH SAC WET PLY) and the number of bad blocks (BBK index) for a number of lots (lots A-G) of memory dies. In this example, for lots A, E, and G, both bad block count from die sort and the PLY values determined, where these sets of directly measured values are underlined. For the other lots, the numbers of bad blocks are also measured at die sort, but the PLY values are determined by interpolation based on the correlation as shown at left as determined by the machine learning process.

The impact of different processing items can be checked at different points during fabrication to allow for PLY data to be interpolated for these different processing items, where the PLY data can be interpolated by both die sort items and process items. This can allow the tracking and monitoring of different sources of error across time and the adjusting of processing parameters according, as illustrated at right of FIG. 9. In the bar graph, the horizontal axis is time, each set of bars are the PLY date of a time interval (e.g., a week) showing the contributions of, in this example, three different PLY error contributions. For example, the upper region 911 can correspond to a lower memory hole critical dimension value, the central region 913 could correspond to leakage times for charge from the charge trap layer across the tunnel layer to the channel region, and 915 could correspond to charge trap layer's thickness (see FIG. 3). This sort of data allows for different possible source of defects to be tracked and parameters adjusted accordingly over time.

Considering the machine learning used, one of several techniques, or a combination of such techniques, can be applied depending on the embodiment, including: deep neural networks (DNNs); distributed random forest (DRF), extremely randomized trees (XRT); generalized linear models (GLMs); and/or gradient boosting machine (GBM). Generalized linear models are an extension of traditional linear models for statistical data analysis, having a flexibility of the model structure unifying regression methods (such a linear regression and logistical regression for binary classification), availability of model-fitting techniques, and the ability to scale well with large datasets.

Gradient boosting machine is an ensemble of either regression or classification tree models, both of which are forward-learning ensemble methods that obtain predictive results using gradually improved estimations. Boosting is a flexible nonlinear regression procedure that helps improve the accuracy of trees, where weak classification algorithms are sequentially applied to the incrementally changed data to create a series of decision trees, producing an ensemble of weak prediction models. While boosting of the trees increases their accuracy, it also decreases speed and user interpretability, whereas the gradient boosting method generalizes tree boosting to minimize these drawbacks.

Figure 10:
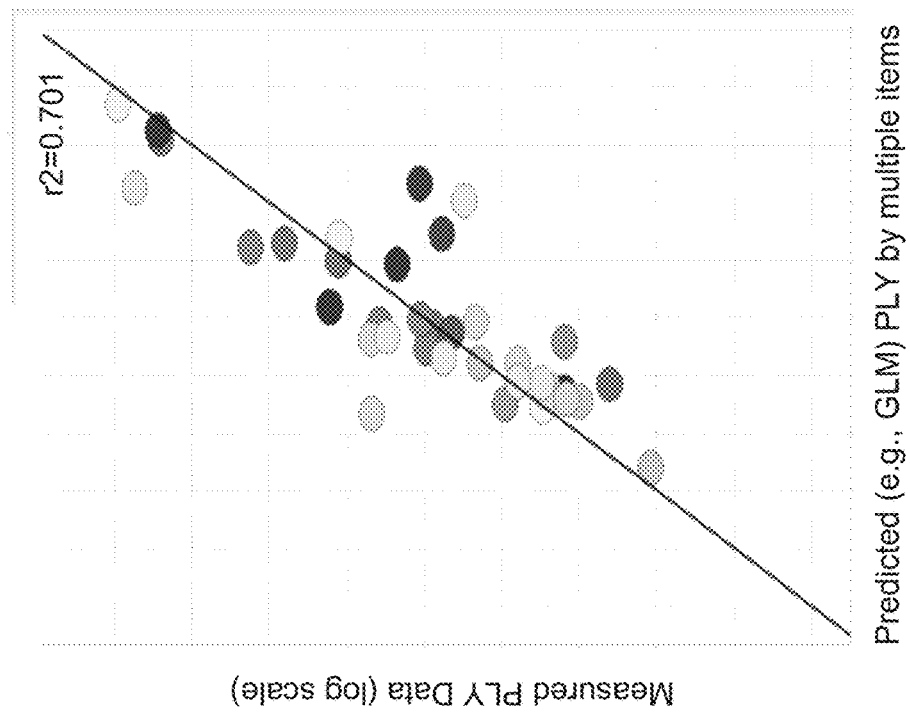
FIG. 10 illustrates the improvement in correlation between bad block count and PLY data obtained by applying interpolation using a generalized linear model embodiment.
Figure 10:
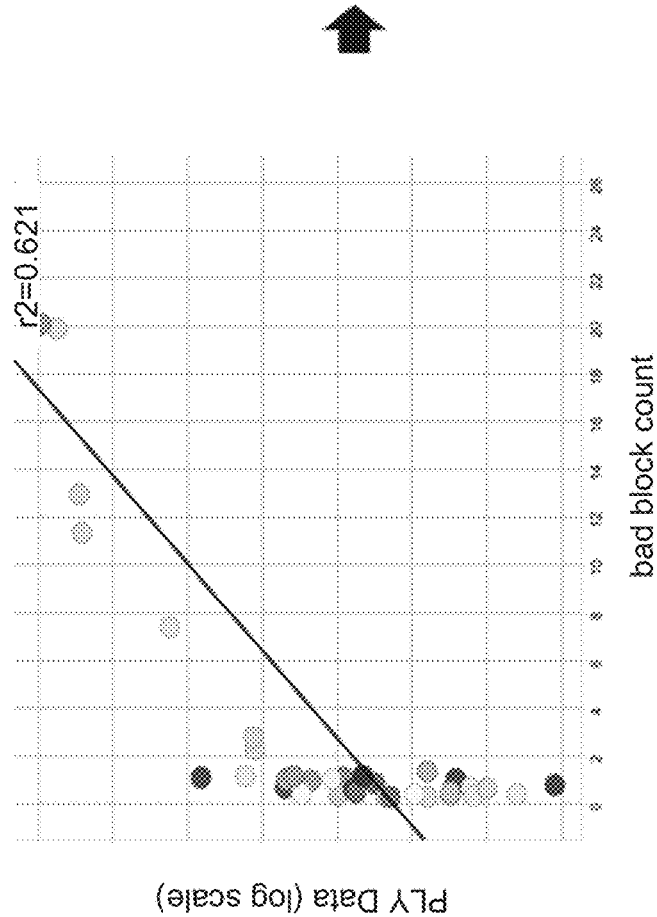

FIG. 10 illustrates the improvement in correlation between bad block count and PLY data obtained by applying interpolation using, in this embodiment, a generalized linear model embodiment. At left, FIG. 10 repeats for comparison the PLY measured data (in a log scale) versus bad block count graph of FIG. 8 based on a conventional single bad block count correlation, while at right FIG. 10 illustrates the PLY measured data (in a log scale) versus predicted PLY values (in a log scale) using four items as interpolated using a generalized linear model. As illustrated in the right side of FIG. 10, by use of the generalized technique, the correlation is improved to $R^2=0.70$ from the $R^2=0.62$ of the conventional single bad block index correlation at left. Once a correlation study of die sort bad block values and PLY data is completed by machine learning, interpolation can be performed, as illustrated with respect to the examples of FIGS. 11A and 11B.

Figure 11B:
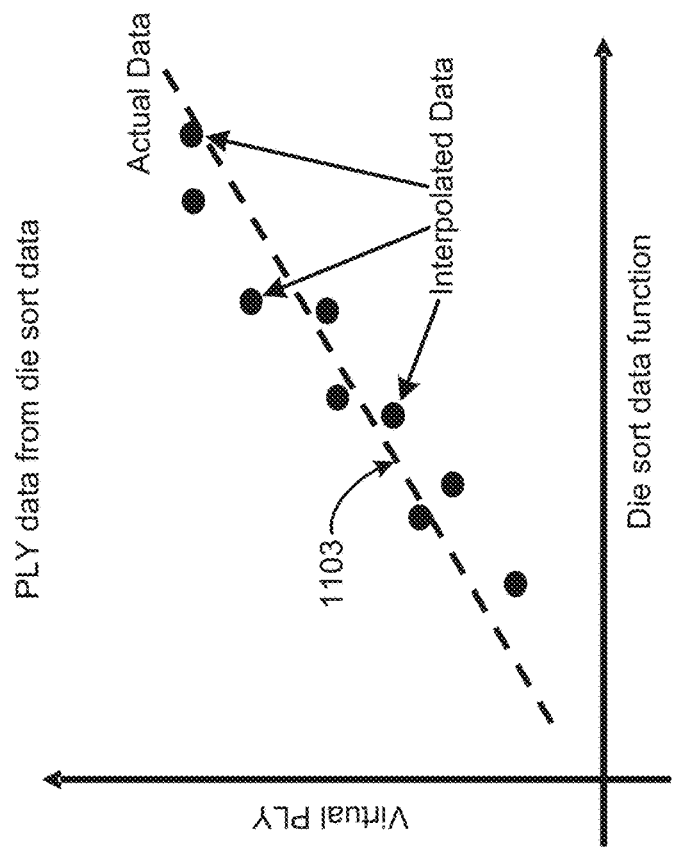
FIGS. 11A and 11B illustrate utilizing a machine learning study to provide different type of virtual PLY data.
Figure 11A:
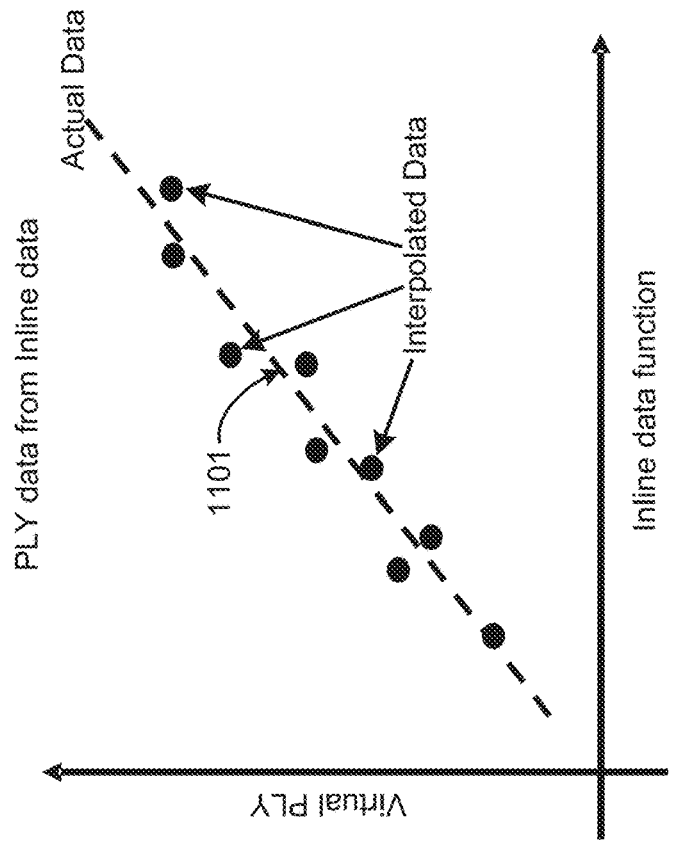

FIGS. 11A and 11B illustrate utilizing a machine learning study to provide different types of virtual PLY data. FIG. 11A is a plot of PLY data from inline testing data, where inline data is data gathered on the memory dies during the course of the fabrication process. The vertical axis is for the virtual PLY values and the horizontal axis is the inline data function, with the line 1101 corresponding to the correlation determined based on actual data. The interpolated data points can then be generated by point analysis based on the die sort bad block values.

FIG. 11B is a plot of PLY data from die sort testing data, gathered on the memory dies as part of the post-fabrication process testing. The vertical axis is the virtual PLY values and the horizontal axis is the die sort (D/S) data function, with the line 1103 corresponding to the correlation determined based on actual data. The PLY data can be determined by the die sort data, and the interpolation by related multiple die sort index values. The correlation data can be confirmed for both inline and die sort data and, if the correlation is good, interpolated data can be used for various studies, such as defective parts per million, yield, and process improvement, to provide data volume, as illustrated by FIGS. 12A and 12B.

Figure 12A:
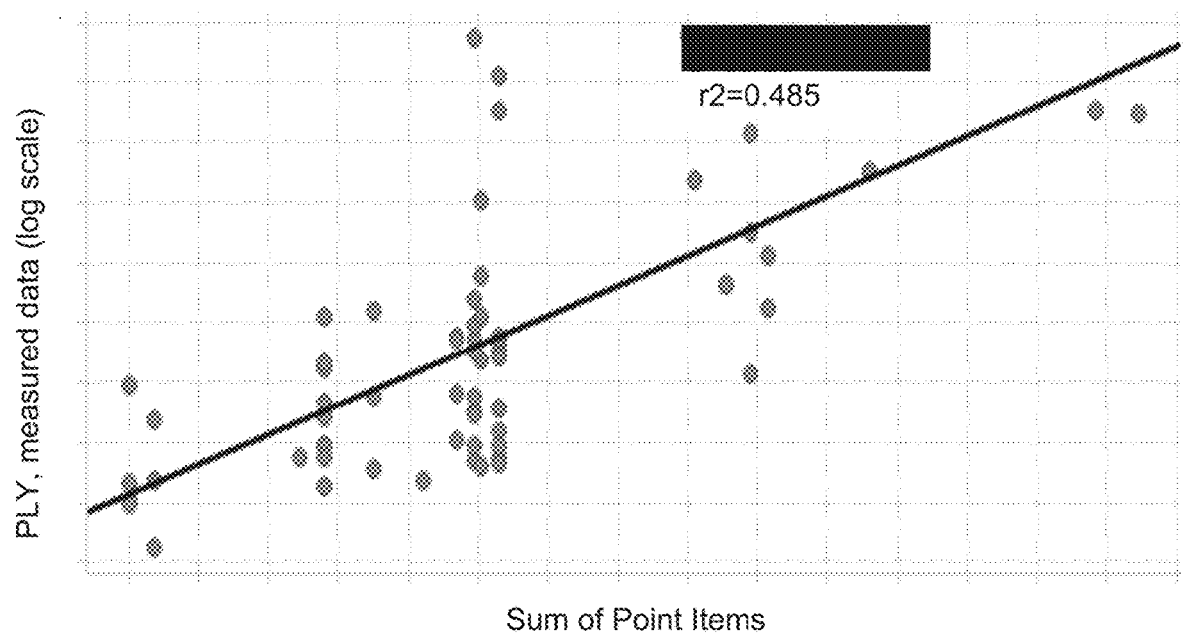
FIGS. 12A and 12B respectively illustrate a point analysis of PLY data by only measured data and with interpolated PLY data at the lot level.
Figure 12B:
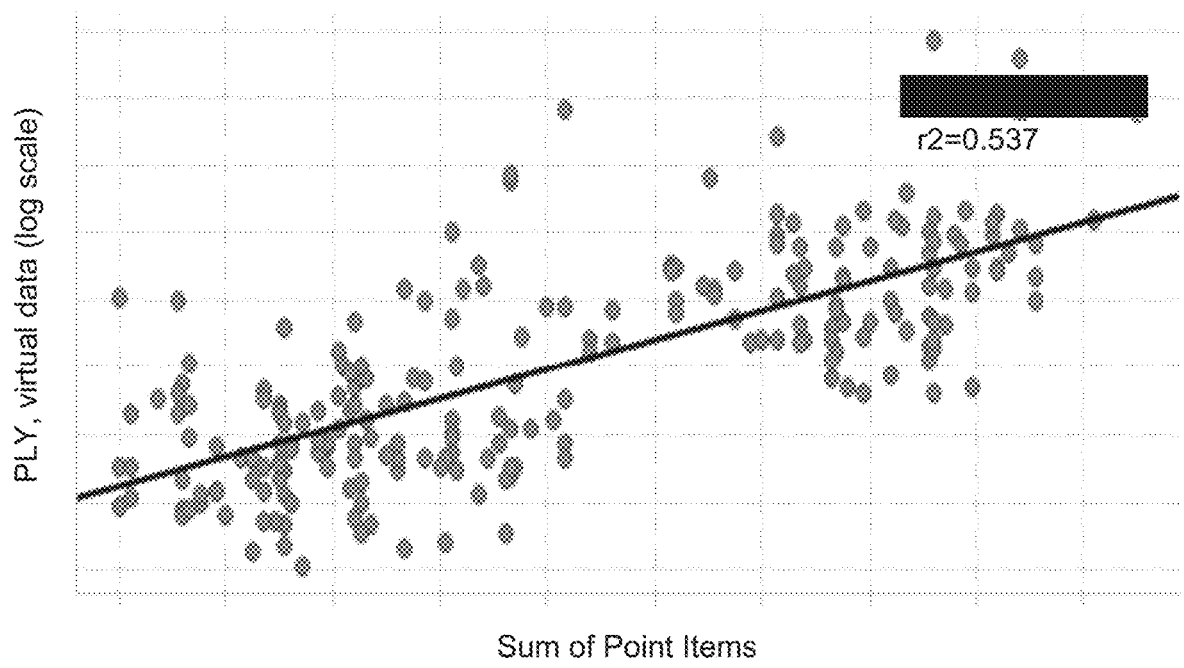

FIGS. 12A and 12B respectively illustrate a point analysis of PLY data by only measured data and with interpolated PLY data at the lot level. In conventional point analysis using only measured data of FIG. 12A, the vertical axis is the measured PLY values in a log scale and the horizontal axis is the defect points summed over a set of several measured defect values. The number of data points is relatively sparse, compared to the total number of memory dies, and correlation is relatively low, with $R^2$=0.485.

FIG. 12B presents a point analysis using virtual quality control data and illustrates the increase in data points through use of interpolated PLY data. (The black rectangle in both FIGS. 12A and 12B is redacted specific numeral information that does not enter into the discussion here.) The horizontal axis is again the defect point data summed over a set of several measured defect values, but not including the virtual data points, and the vertical axis is the predicted PLY values in a log scale. As can be seen by comparing FIG. 12A to FIG. 12B, the number of data points increased is greatly increased by the use of virtual quality control data. By using interpolated volume data, the correlation accuracy improved from $R^2$=0.485 (without interpolated data) to $R^2$=0.537. This allows for a clear correlation to be obtained for key process steps by interpolating inline data by big data analyses to contribute to processing improvements and die sort/early failure rate correlation studies.

The incorporation of virtual quality control data at inline (i.e., during the fabrication process) can be particularly useful as it can provide faster feedback for adjusting processing parameters to decrease the number of defects, such as measured by defective parts per million (DPPM). Quality control data collected inline during production is fastest way to detect device failures, but data volumes are traditionally limited; however, by interpolating all data by inline data, the volume can be increased and analysis accuracy will be improved, providing a faster feedback speed for adjusting processing parameters during the fabrication process. This can be illustrated with respect to FIGS. 13A and 13B.

Figure 13A:
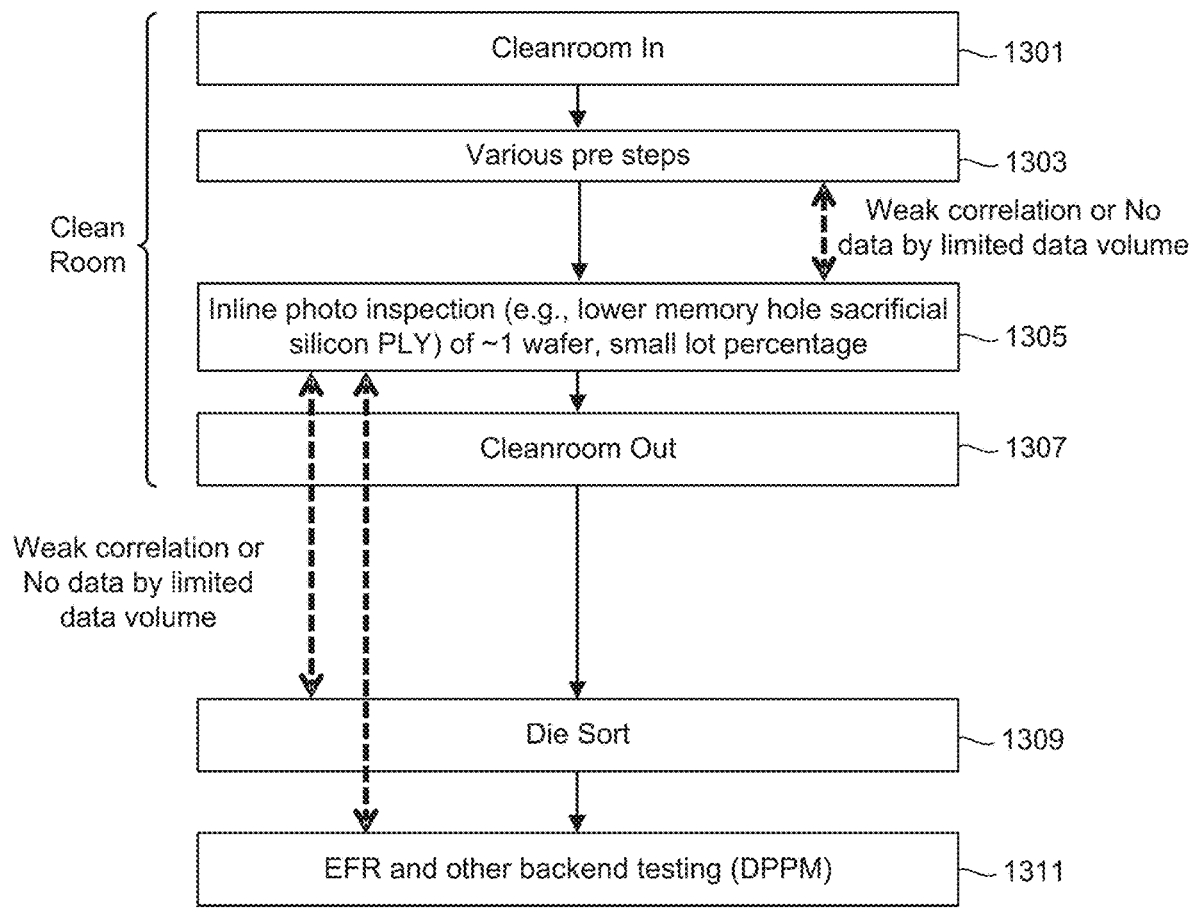
FIGS. 13A and 13B respectively present conventional sampling for quality control and the use of virtual quality control by machine learning to illustrate the advantage of incorporating virtual quality control data.
Figure 13B:
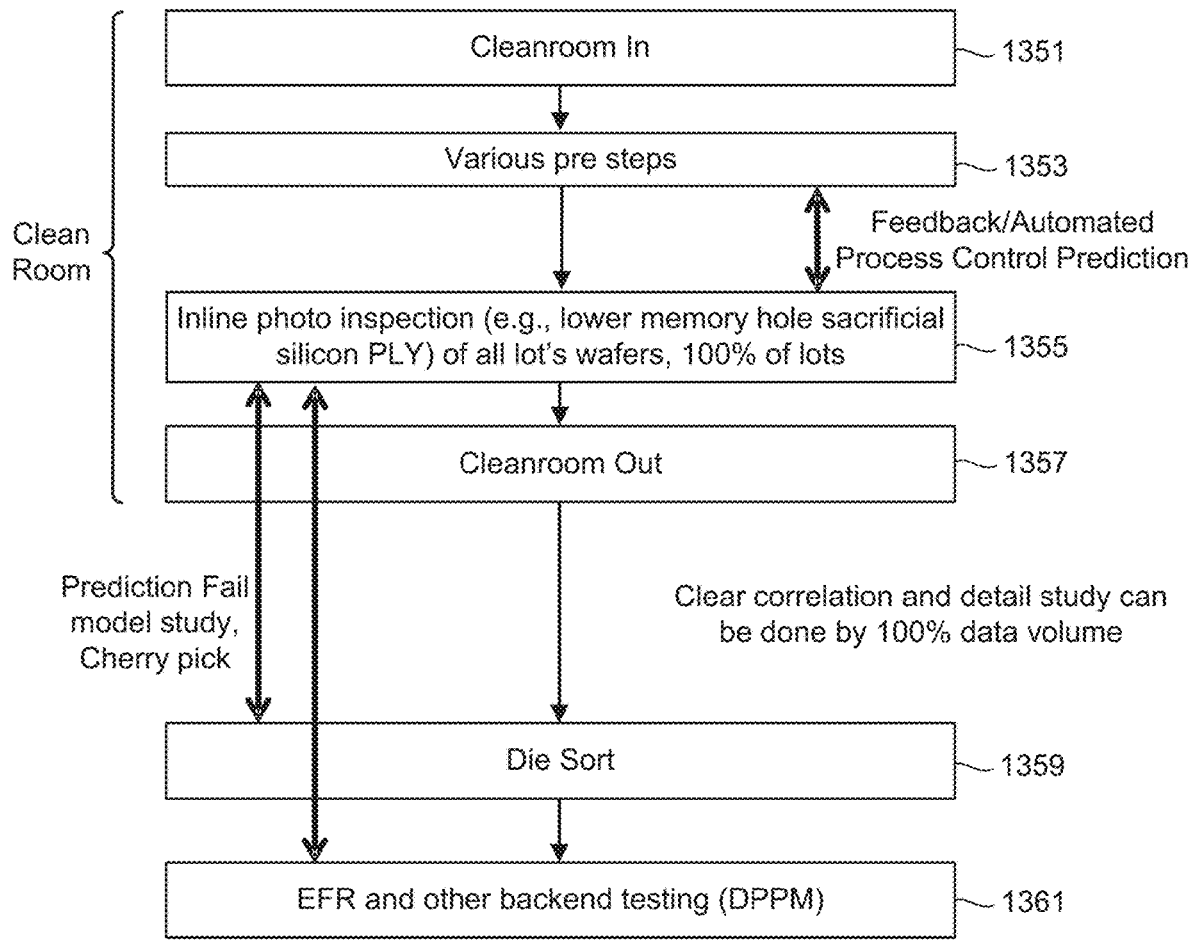

FIGS. 13A and 13B respectively present conventional sampling for quality control and the use of virtual quality control by machine learning to illustrate the advantage of incorporating virtual quality control data. In the sequences of FIGS. 13A and 13B, the same sequence is shown, but the amount and location of testing and resultant incorporation of processing feedback is different.

In the conventional processing sequence of FIG. 13A, the cleanroom operations are the fabrication and inline testing processes, and including cleanroom in at block 1301, followed by various proceeding steps to fabricate and prepare a sample for imaging at block 1303, corresponding to step 601 of FIG. 6 in which the samples of the integrated circuits are prepared for imaging. Block 1305 is the inline photo inspection, corresponding to step 603 of FIG. 6, such as lower memory hole sacrificial silicon PLY data. In the conventional flow of FIG. 13A, only a relatively small amount of testing is performed, due to time and cost limitations and also due to resultant yield loss for tests that render the device subsequently unusable. For example, only a small percentage of the wafer lots (e.g., 20%), and only perhaps a single wafer per lot, are tested. Due to the limited data volume, the correlation between the collected PLY data and bad block count is low, as discussed above with respect to FIG. 8, so that that amount of feedback and advanced process control that can provided to earlier processing steps is consequently limited. The memory dies leave the clean room at block 1307, after which subsequent testing can be performed on the completed die.

Die sort follows at 1309, which can include bad block determination and other testing, followed by additionally early fail rate (EFR) and other backend testing at block 1311 to determine defect rates (DPPM), where the following uses the bad block value as the main example. At both the die sort and backend testing, there is again weak correlation or a lack of data due to the low proportion of samples used in some tests. This again results limited feedback for the processing operations. Additionally, the backend tests of block 1311 and, in some cases, die sort in block 1309 are often performed at different physical locations, involves shipping of devices and consequent delays for even what feedback is available.

FIG. 13B illustrates the incorporation of quality control data by machine learning and is arranged in blocks similar to those of FIG. 13A, where blocks 1351 and 1353 can be as described for blocks 1301 and 1303. The inline inspection of block 1355 is similar to the inline inspection of block 1305, except now, by use the virtual quality control data obtain by interpolation as illustrated in FIG. 9, feedback/advanced process control data for all (or at least the majority) of wafers of all lots can be provided back to the earlier processing steps of block 1353. In addition to the increased amount of feedback available, this feedback is also provided as part of the inline processing and is consequently much faster that feedback from the die sort or backend tests. The memory dies leave the clean room at block 1357, after which subsequent testing can be performed on the completed die.

Die sort again follows at 1359, which can be bad block and other testing (e.g., resistance, current, threshold voltages), followed by additionally early fail rate (EFR) and other backend testing at block 1361 to determine defect rates (DPPM). The testing and samples of blocks 1359 and 1361 can be the same or similar as for blocks 1309 and 1311 of FIG. 13A, but now the machine learning techniques described above are applied to perform a prediction fail model and cherry picking criteria that are applied at block 1355 to interpolate the virtual quality control data that is used to generate the feedback to block 1353 to adjust the processing parameters for subsequently produced memory die. The prediction fail model study and determination of cherry picking criteria can be performed at regular intervals (weekly, for example) to update the feedback/advanced processing control interpolation used between blocks 1353 and 1355. As illustrated conceptually in FIGS. 9 and 11A, this relation between blocks 1353 and 1355 has the merit of allowing the interpolation of inline data (block 1355) by the previous steps (block 1353) by interpolating a 100% of the die sort data (block 1359) after certain process steps are completed. By using virtual quality control data, a clear correlation and detail study can be done by 100% data volume; and by optimizing quality control measurement volume with the virtual PLY method, quality control steps can be minimized and improvement cycle times and virtual fabrication concept feasibility.

Figure 13C:
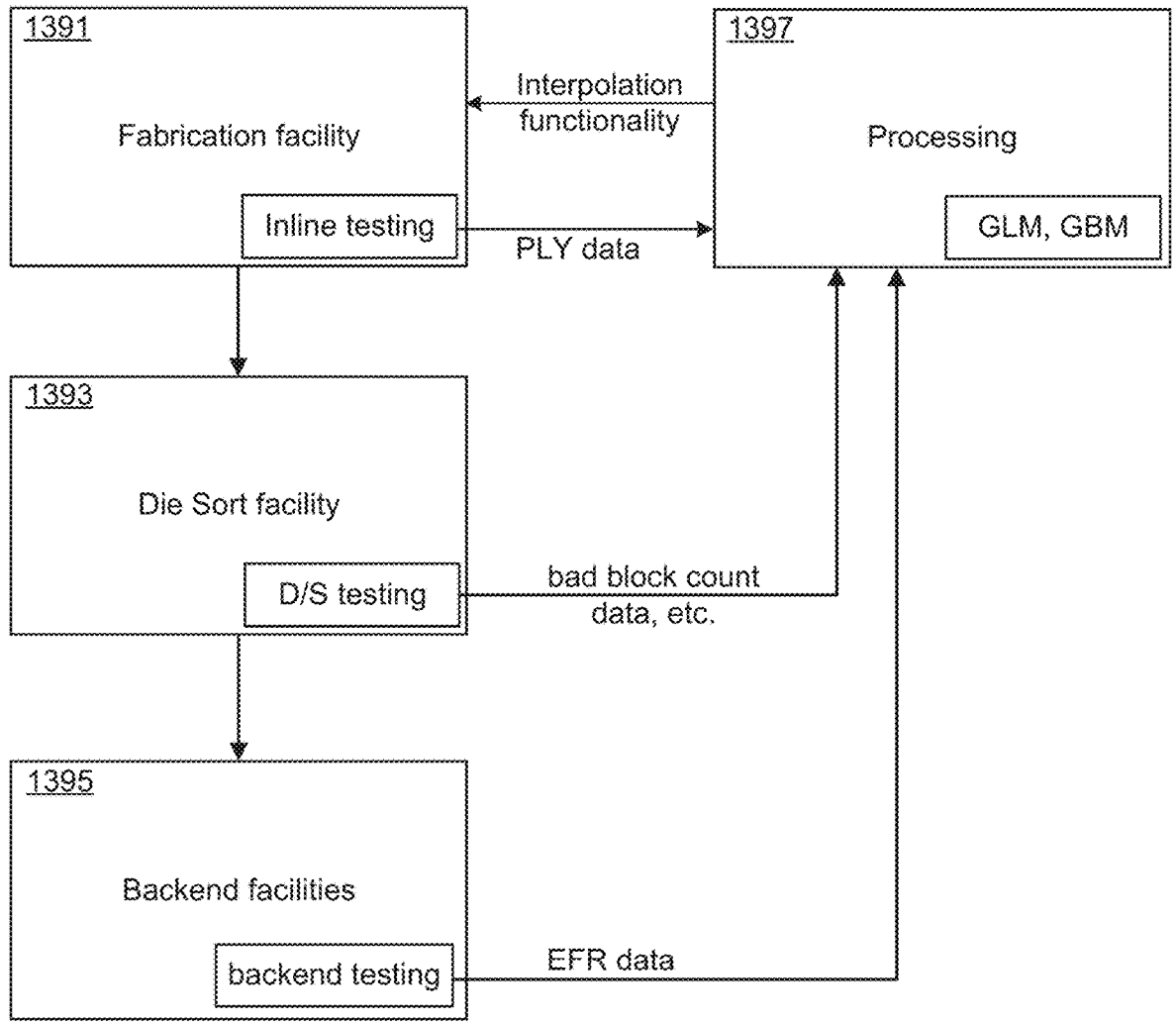
FIG. 13C represents an embodiment for the different physical facilities in which the processes of FIG. 13B would be performed.

FIG. 13C represents an embodiment for the different physical facilities in which the processes of FIG. 13B can be performed. The fabrication facility 1391 is the manufacturing facility, including cleanrooms, in which the memory dies or other integrated circuits are manufactured. Inline testing, such as for PLY values, is performed at the fabrication facility 1391. After being manufactured, the integrated circuits are transferred to a die sort facility 1393. The die sort facility 1393 may be part of or located near by the fabrication facility 1391, or at a different location that would require shipping. Following die sort, the integrated circuits are typically shipped to any backend facilities 1395 as part of the further quality control and customer distribution.

To perform inline tests (such as for PLY data), the die sort testing (such as bad block count data), and additional bad end testing (such as EFR) requires any operations at one location to be finished before the integrated circuits can transferred to the next location for the subsequent set to tests to be done there. These various data sets for a set of memory circuits or other integrated circuits can then be provided to a processing facility 1397, where this can be one or more locations, including the fabrication facility 1391, die sort facility 1393, and backend facility, or other locations, such as in the cloud. Under the arrangement of FIG. 13A, in addition to the relative lack of data, all of these different data sets would be provided to the processing 1397 to determine updates to processing parameters, with the resultant delays in feedback due to the transfers between the different facilities. In contrast, under the arrangement of FIG. 13B, the different data sets can be used to perform the machine learning (e.g., generalized linear models, gradient boosting machine, neural networks, randomized trees) study to generate the interpolation functionality, such as interpolation algorithms for use in advanced processing control software, that can be used within the fabrication process for feedback and automated process control based on the inline testing.

With respect to the processing 1397, including the application of machine learning, this can be implemented by one or more processors using hardware, firmware, software, or a combination of these. The software used can be stored on one or more processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

The training phase is typically more computationally intensive and can be performed in the cloud, for example, while inferencing may be performed more locally, such as on computational facilities at the fabrication facility. Examples of the processing units that can be used for the machine learning can include one or more of CPU (central processing unit), GPU (graphic processing unit), TPU (tensorflow processing unit), and NPU (neural processing unit) devices, among others.

The discussion so far has mainly focused on virtual PLY data interpolation, but the techniques can also be applied to metrology, such as critical dimension data for the memory hole bowing as illustrated in FIG. 5. To obtain all chip metrology data virtually, machine learning (such as gradient boosting machine and generalized linear model techniques) is performed by measured wafer CD values and its die sort characteristics and then, by using the correlation, all virtual CD data can be interpolated. This can be illustrated with respect to FIG. 14.

The following focusses on the critical dimension example, and more specifically to its application to upper memory holes, but can be extended to other metrological data inspection steps. In addition to the critical dimension measurement of line widths and hole diameters at specified locations on a semiconductor wafer that can be performed by a scanning electron microscope, for example, other examples of metrology inspection can include overly and thicknesses of films. In forming a semiconductor wafer, thin films are often applied on the surface of the wafer and their thickness can be measure by use of an ellipsometer, for example. With respect to overlays, a metrology system can check the accuracy of a shot overlay (such as by an overlay tool) of layer patterns as transferred on to the wafer.

Figure 14:
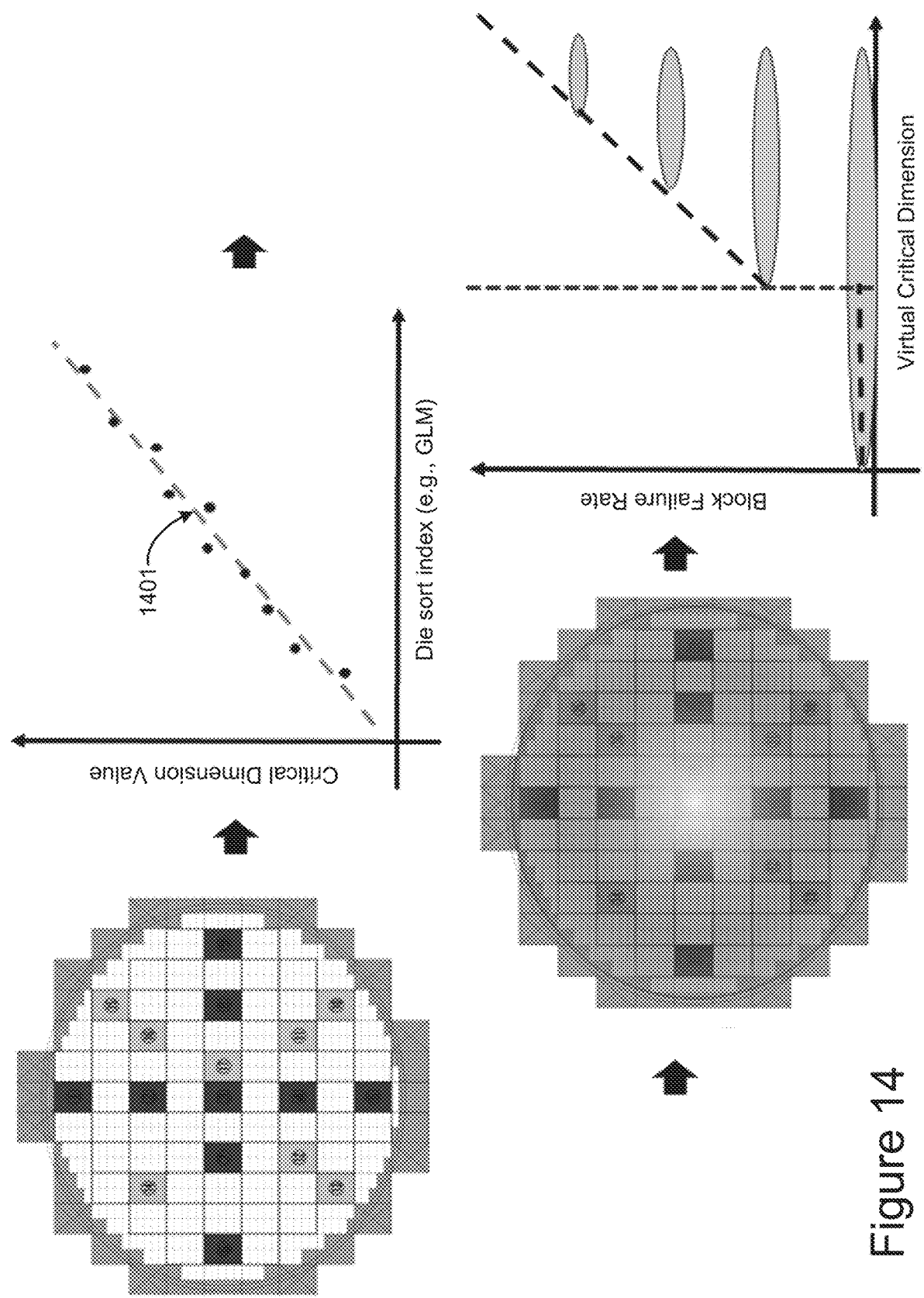
FIG. 14 present an embodiment for a sequence schematically representing virtual critical dimension interpolation at the chip level.

FIG. 14 present an embodiment for a sequence schematically representing virtual critical dimension interpolation at the wafer level. To screen with better accuracy, chip level interpolation and virtual upper memory hole CD values are generated for data wafers and chips without directly measured CD data. A correlation of die sort data (such as bad block count or other circuit characteristics like resistance, current, or threshold voltages) with CD measured data is obtained, and then, by using the reference correlation, data can be interpolated for chips and wafers for which the data was not directly measured. All CD related values can then be interpolated, and the correlation to early failure rate DPPM data (such as in term of block failure rate) checked at chip level to decide upon wafer/chip rejection criteria for all samples.

The sequence of FIG. 14 is similar to that described above with respect to FIG. 9. At far left, FIG. 14 illustrates the measurement of chip level CD data from a subset of the memory die or other integrated circuits on a wafer. In the example, for a sample wafer a subset of around a quarter of the chips are selected for testing, where these include a series of chips running both vertically and horizontally, as illustrated by the darker squares, and series of diagonal chips, as represented by the intermediate gray squares. As represented at center left, machine learning is applied to perform universal line fitting of 1401 from the measured data points to generate a correlation between CD values and the die sort index. As described above, the machine learning used can be one of several techniques, or a combination of such techniques, depending on the embodiment, including: deep neural networks (DNNs); distributed random forest (DRF), extremely randomized trees (XRT); generalized linear models (GLMs); and/or gradient boosting machine (GBM).

As represented schematically at center right by the darkening of the whole wafer, virtual CD interpolation can be applied to all, or at least a majority of, chips and wafers of a lot. At far right, the relationship of the all-chip interpolated virtual CD data to block failure rate can then be used for studying the early failure rate (i.e., block failure rate). As illustrated at the far right of FIG. 14, different ranges of virtual CD values correspond to different block failure rates, with rejection criteria determined as represented by the broken line.

By using the process illustrated by the sequence of FIG. 14 the ratio of the number of chips with CD data can become 100%, whereas the percentage of memory dies that are actually measure by scanning electron microscope is typically, depending on the feature being measured, in the range of 1% to a few hundredths of a percent. This increase in chip level data can be used to detect grown bad block (i.e., bad blocks that occur one a device is in use) failures that, previously, could not be readily detected due limited CD data and, more generally, be used for cherry picking of test samples and studies of process improvement.

Figure 15A:
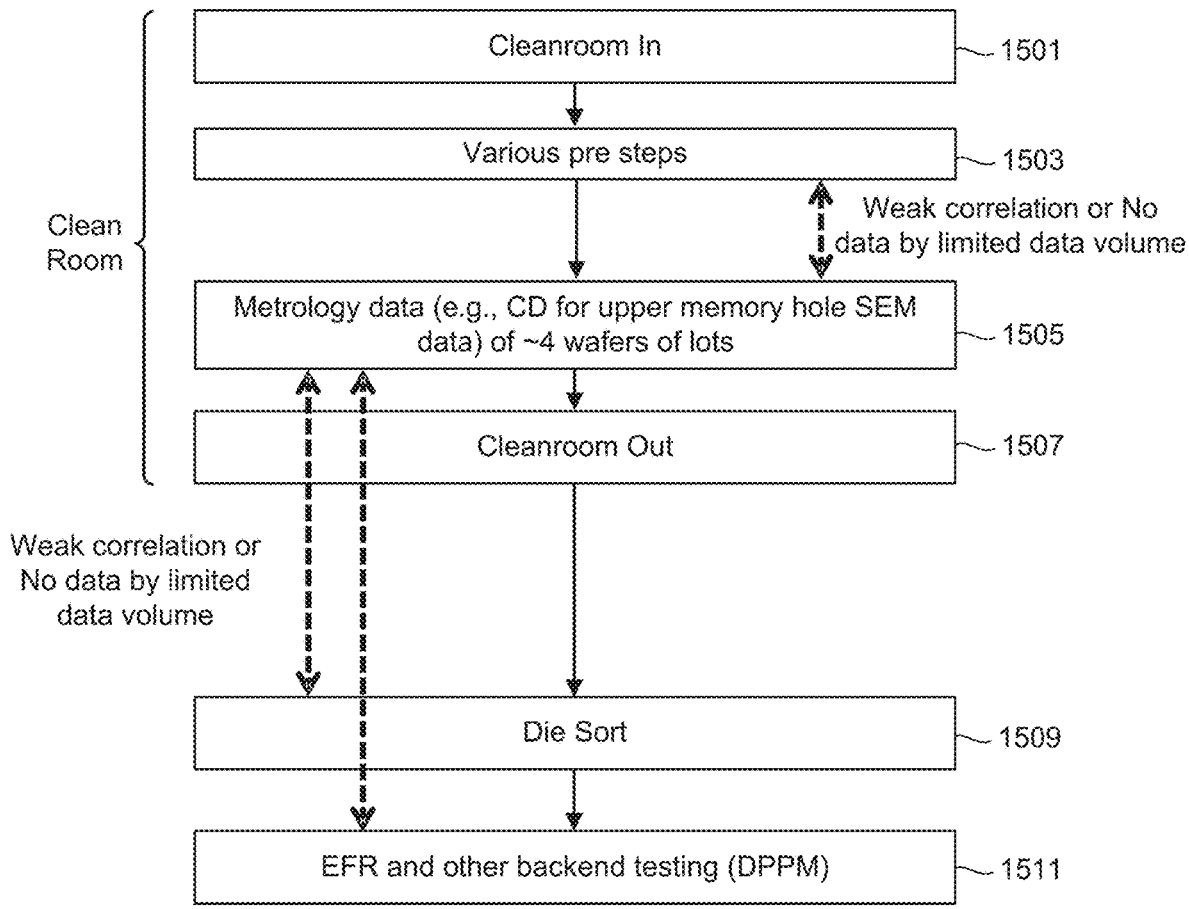
FIGS. 15A and 15B respectively present conventional sampling for quality control and the use of virtual quality control by machine learning to illustrate the advantage of incorporating virtual quality control data for the critical dimension example.
Figure 15B:
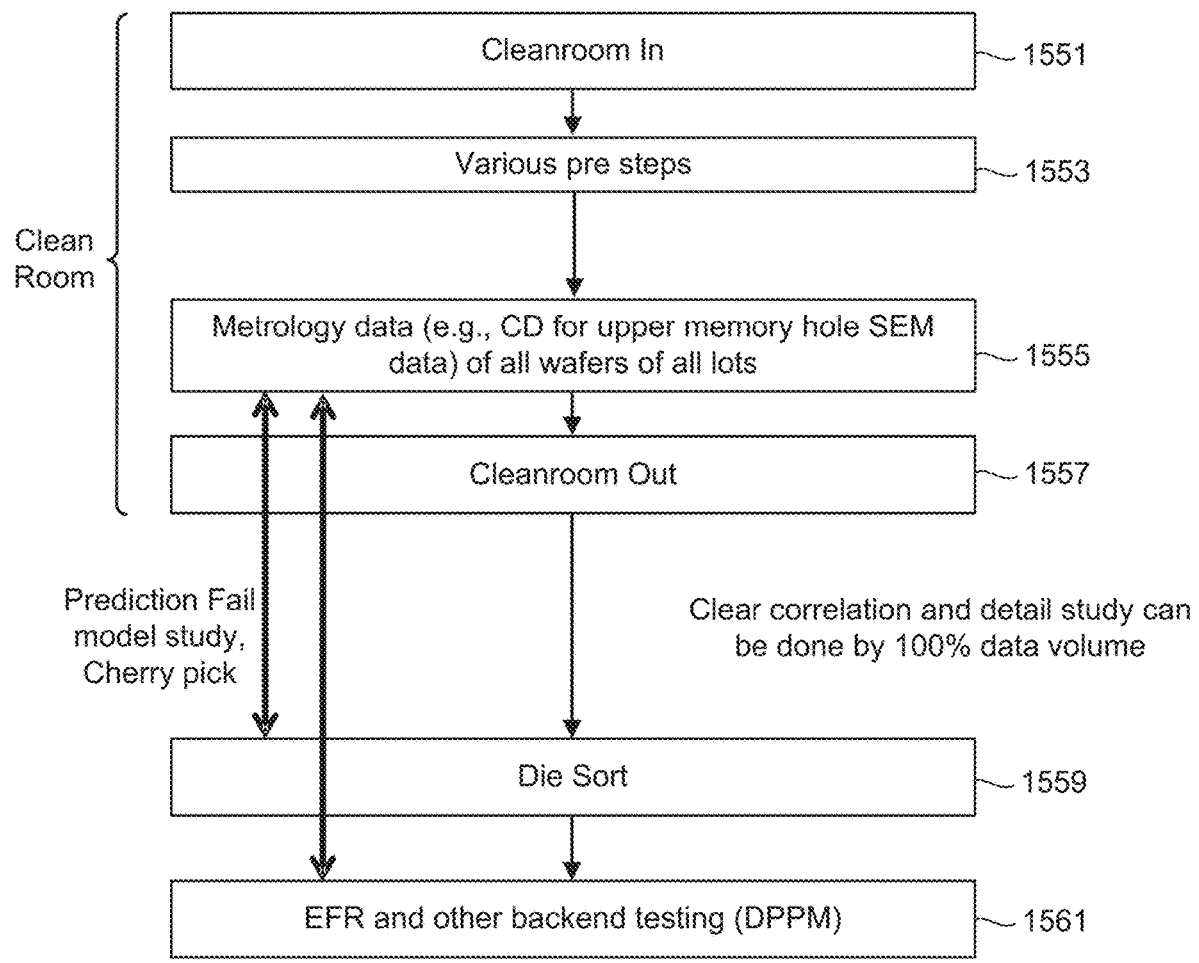

FIGS. 15A and 15B respectively present conventional sampling for quality control and the use of virtual quality control by machine learning to illustrate the advantage of incorporating virtual quality control data for the critical dimension example. In the sequences of FIGS. 15A and 15B, the same sequence is shown, but the amount and location of testing and resultant incorporation of processing feedback is different. Relative to FIGS. 13A and 13B, block 1505/1555 differ in that they now relate to CD or other metrology data rather than PLY data.

In the conventional sampling of quality control values sequence of FIG. 15A, the cleanroom operations are the fabrication and inline testing processes and include cleanroom in at block 1501, followed by various proceeding steps to fabricate and prepare a sample for imaging at block 1503, corresponding to step 601 of FIG. 6 in which the samples of the integrated circuits are prepared for imaging. Block 1505 is the metrology data collection (e.g., CD for upper memory hole scanning electron microscope), corresponding to step 603 of FIG. 6. In the conventional sampling of FIG. 15A, only a relatively small amount of testing is performed, due to time and cost limitation and also due to resultant yield loss for tests that render the device subsequently unusable. For example, only a small percentage of the wafer (e.g., ~2-5 per lot) are tested. Due to the limited data volume, the correlation between the collected CD data and bad block count is low, so that that amount of feedback and advanced process control that can provided to earlier processing steps is consequently limited. The memory dies leave the clean room at block 1507, after which subsequent testing can be performed on the completed die.

Die sort follows at 1509, including bad block and other testing (e.g., resistance, current, threshold voltages), followed by additionally early fail rate (EFR) and other back-end testing at block 1511 to determine defect rates (DPPM). At both the die sort and backend testing, there is again weak correlation or a lack of data due to the low proportion of samples used in some tests. This again results limited feedback for the processing operations. Additionally, the backend tests of block 1511 and, in some cases, die sort in block 1509 are often performed at different physical locations, involves shipping of devices and consequent delays for even what feedback is available.

FIG. 15B illustrates the incorporation of quality control data by machine learning and is arranged in blocks similar to those of FIG. 15A, where blocks 1551 and 1553 can be as described for blocks 1501 and 1503. The CD SEM or other metrology data of block 1555 is similar to the CD SEM or other metrology data of block 1505, except now, by use the virtual quality control data obtain by interpolation as illustrated in FIG. 14, feedback/advanced process control data for all (or at least the majority) of wafers of all lots can be generated. The memory dies leave the clean room at block 1557, after which subsequent testing can be performed on the completed die.

Die sort again follows at 1559, at which can be performed by bad block and other testing, followed by additionally early fail rate (EFR) and other backend testing at block 1561 to determine defect rates (DPPM). The testing and samples of blocks 1559 and 1561 can be the same or similar as for blocks 1509 and 1511 of FIG. 15A, but now the machine learning techniques described above are applied to perform a prediction fail model and cherry picking criteria that are applied at block 1555 to interpolate the virtual quality control data. The prediction fail model study and determination of cherry picking criteria can be performed at regular intervals (weekly, for example). By using machine learning, such as generalized linear models or gradient boosting machine embodiments, for limited die sort characteristics, all production chip data can be interpolated from the limited measured data, which can then be used for cherry picking and prediction of failure issues. By optimizing quality control measurement volume with virtual critical dimension methods, other quality control steps can be minimized, improving cycle times and virtual fabrication concept feasibility. In terms of the physical facilities for the processes of FIG. 15B, these can be as described above with respect to FIG. 13C.

Figure 16:
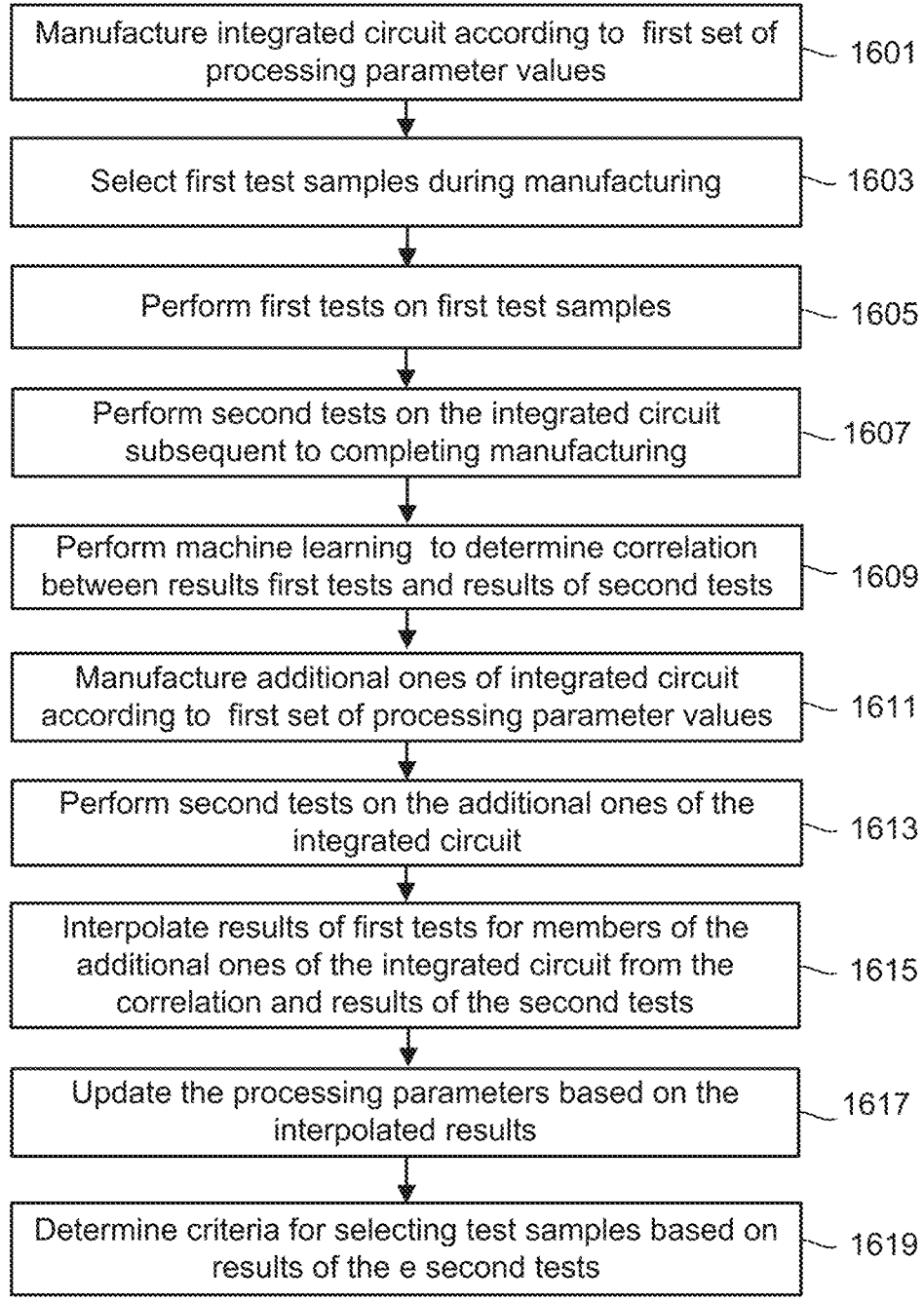
FIGS. 16 and 17 are flowcharts for embodiments of virtual PLY interpolation and virtual CD interpolation, respectively corresponding the schematic representations of FIGS. 13B and 15B.
Figure 17:
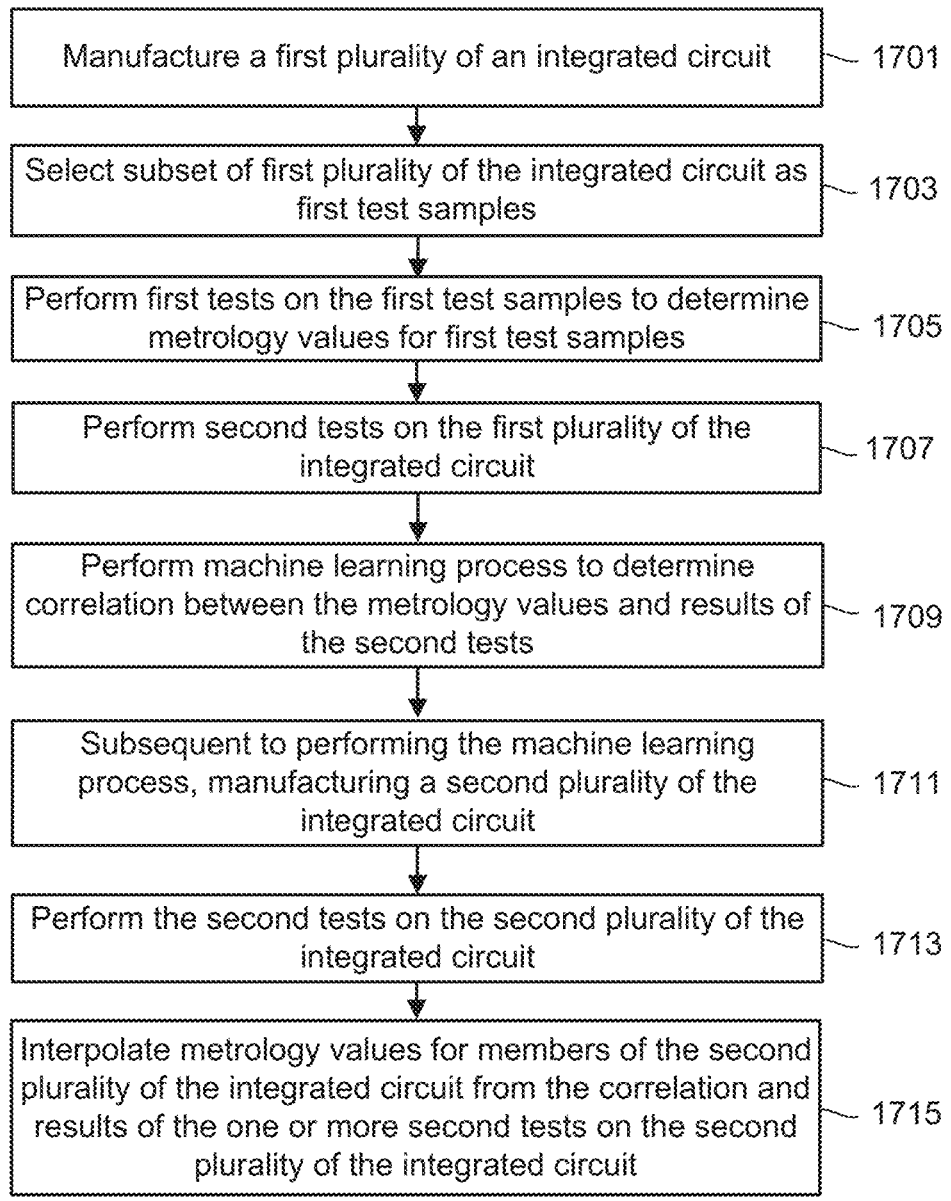

FIGS. 16 and 17 are flowcharts for embodiments of virtual PLY interpolation and virtual CD interpolation, respectively corresponding to the schematic representations of FIGS. 13B and 15B. The flow of FIG. 16 begins at step 1601 with the manufacturing of a non-volatile memory device or other integrated circuit at a fabrication facility according to a first set of processing parameter values. This can be any of the processing processes used, for the main embodiments here, to form non-volatile memory circuits, such as for the 3D NAND memory described above, as well other architectures and other non-volatile memory technologies (e.g., NRAM, ReRAM). A subset of the integrated circuits are selected during the manufacturing process as test samples for a first set of tests at step 1603, with the one or more first test done at step 1605. As discussed above, the number of die selected for this inline testing is typically a small percentage of the production. The inline test data of step 1605 can be generated by a scanning electron microscope and can include both the PLY data related to a sacrificial etch and the lower memory holes, as in the primary example above, also other inline test data. At step 1607 one or more second tests on the integrate circuits are performed after completing the manufacturing process, where this can include one or both of die sort stage testing (such as bad block counts) and other backend testing (such as early failure rate data).

Based on the results of the first tests and the second tests, one or more processors can then apply machine learning to determine a correlation between the two sets of tests for the integrated circuit at step 1609, where the machine learning can use one or more of generalized linear models, gradient boosting machine, deep neural networks, distributed random forest, or extremely randomized trees, for example. Once the correlation is established, additional examples of the integrated circuit can be manufactured at step 1611 and the second test performed on these additional examples at step 1613. Based on the correlation from step 1609 and test results from step 1613, at step 1615 results for the first tests (e.g., PLY data) can interpolated as described above with respect to FIGS. 9 and 13B, for example. The interpolated results of step 1615 can be used part of the feedback/advanced process control for adjusting the processing parameter values at step 1617. The results of the second test values can then also be used for cherry picking of test samples at step 1619.

The flow of FIG. 17 is for the example of virtual CD interpolation, corresponding the schematic representations of FIG. 15B, and begins at step 1701 with the manufacturing of a non-volatile memory device or other integrated circuit at a fabrication facility. This can be any of the processing processes used, for the main embodiments here, used to form non-volatile memory circuits, such as for the 3D NAND memory described above, as well other architectures and other non-volatile memory technologies (e.g., NRAM, ReRAM). A subset of the integrated circuits are selected as test samples at step 1703, where, as discussed above, the number of die selected is typically a small percentage of the production. At step 1705 one or more first tests are performed on the first test samples to determine a corresponding one or more critical dimension or other metrology values for each of the first test samples. At step 1707 one or more second tests on the integrate circuits are performed for the first plurality of the integrated circuit, where this can include one or both of die sort stage testing (such as bad block counts) and other backend testing (such as early failure rate data).

Based on the metrology values and the results of the second tests, one or more processors can then apply machine learning to determine a correlation between the two sets of test results for the integrated circuit at step 1709, where machine learning can use one or more of generalized linear models, gradient boosting machine, deep neural networks, distributed random forest, or extremely randomized trees, for example. Once the correlation is established, additional examples of the integrated circuit can be manufactured at step 1711 and the second test performed on these additional examples at step 1713. Based on the correlation from step 1709 and test results from step 1713, at step 1715 results for the virtual critical dimension or other metrology values can interpolated as described above with respect to FIGS. 14 and 15B, for example.

Consequently, the techniques described above for virtual quality control interpolation and process feedback can significantly improve costs and efficiencies in the manufacture of non-volatile memories and other integrated circuits by generating more extensive test data and more rapid feedback. In addition to the specific examples and embodiments presented, the techniques can also be applied to selective testing, where if correlations between die sort and inline data are determined, it can be known whether or not a chip or wafer can pass die sort testing without the die sort testing with it having to be performed, allowing the die sort testing to be fully or partially skipped, contributing to die sort test cost reductions.

In an additional set of embodiments, further use is made of data that is often obtained as part of the die sort or inline testing process of integrated circuits, such as the multi-layer memory structures described above. In such a complex structure, composed of multiple complex circuitry layers, although it would be highly useful to have information on the features of each of the layers, such as CD values for memory holes, it is impractical to directly measure such values for more than a small subset of the wafers, chips, and layers due to the time and expense of such testing and also since many of these test are destructive to the device. However, it is common to perform tests of other properties of the circuit for many, even all, of the circuit elements of a circuit for their electoral properties. For example, during die sort or inline testing of a multi-layer memory circuit it is common to test many or all of elements such as the word lines for capacitance and resistance values. By applying techniques such as those presented above, based on testing of a subset of the devices for features such as memory hole CD values, the electrical data from die sort and/or inline test data can be used to provide virtual metrology data for features such as memory hole profiles and other features of the circuit.

Although the following discussion will again be presented in the context of a multi-layer non-volatile memory structure and focus on the feature of memory hole CD of the layers, it can be more generally applied to other circuit features that can be modelled and predicted based upon measured electrical or other data determined as part of the inline, die sort, or other test data collected for the device.

As discussed above, memory hole CD control is an example of an important feature in the fabrication of the 3D memory structures illustrated in FIGS. 1 and 2 as it is directly related to yield and reliability. As such, it would be highly useful to be able to obtain memory hole CD profiles for all wafers and dies. However, it is not practical to obtain such information as part of inline or die sort testing for all layers of all dies and wafers, due to the time and expense this would involve, but also as such tests are often destructive to the device. In a typical arrangement, inline or die sort testing will only perform SEM or optical CD measurements for selected features and then for only a small percentage of the chips, such as performing optical CD testing on only a few selected word line layers for only a few tenths or hundredths of a percent of the memory dies and making SEM CD measurements on the top of a similarly small percentage of the memory dies. There are, however, other inline and die sort test that are performed on most or even all of the layers of the memory die.

As part of one or both of the inline and die sort testing, it is common the make electrical measurements of the die's circuitry to determine defective memory devices or defective portions, such as bad memory blocks. For example, the word lines of each layer of each die may be measured for its resistance and capacitance as part of die sort and device characterization, as are the electrical properties of other elements. This information on the electrical properties of the word lines running in one direction (the "X" direction) of a layer can then be used to predict the CD values of features in the other direction (the "Y" direction) of the layer through machine learning. The following discussion develops a model and prediction system for memory hole profiles based on a machine learning data set for such memory hole profiles that can be used to estimate the memory hole profiles for all wafers and chips.

Figure 18:
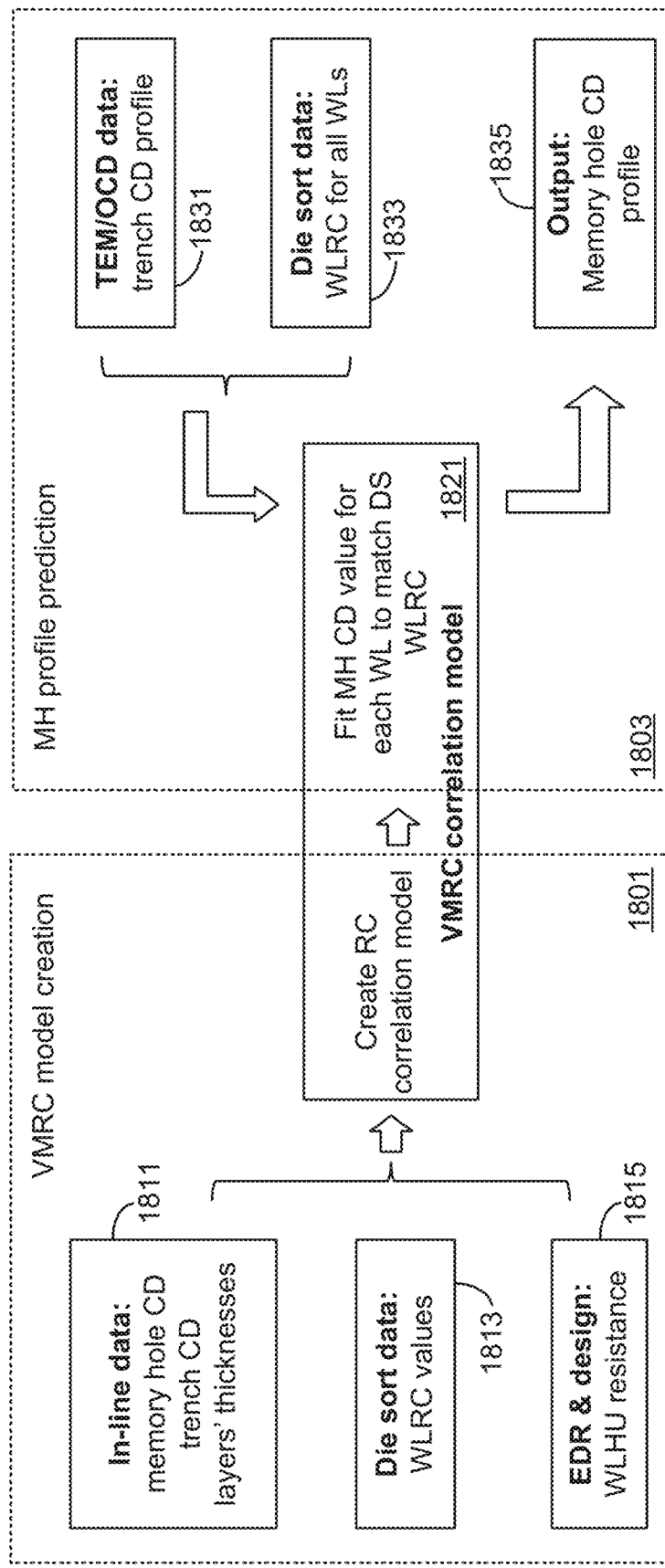
FIG. 18 illustrates some of the components of an embodiment of a virtual metrology approach for use of die sort and inline test data.

FIG. 18 illustrates some of the components of an embodiment of a virtual metrology approach for use of die sort and inline test data. The process includes a virtual methodology resistance/capacitance (VMRC) model creation 1801 for the creation of an RC correlation model and memory hole profile prediction 1803 to fit the memory hole value for each word line to match the word line resistance/capacitance (WLRC) data. One set of the inputs to the VMRC model creation can include inline testing data 1811 including CD values for features such as memory holes, trenches (e.g., silica trenches etched into the structure such as used to separate regions), and other feature as determined by SEM and optical testing as determined for a subset of the layers of a subset of the memory on a subset of the wafers. The inline testing data 1811 for these subsets can also include thickness measurements for layers of the memory structure of FIGS. 1 and 2 such as dielectric layers and the various layers of the word line/control gate structures. The die sort data testing data 1813 inputs for the virtual methodology resistance/capacitance model creation can include electrical measurements such as word line resistance/capacitance data. In additional to resistance and capacitance values for word lines, electrical data for other circuit elements, such as select lines, bit lines, source lines, logic lines, or other features appropriate to a given circuit design from die sort can similarly be used depending on the embodiment. In addition to the inline data 1811 and die sort data 1813, input to the model creation can also include electric design rule (EDR) and design data 1815, such as word line hook-up (WLHU) resistance. Based on these inputs, a virtual methodology RC (or other electrical data) correlation model 1821 can be created.

Once the virtual methodology correlation model 1821 is created based the input of sample data from a subset of devices, it can then be used for memory hole profile or other feature prediction 1803. On the profile prediction side, the inputs can include the die sort data 1833, such as the word line RC values for all of the word lines or other electrical data for which the correlation model 1821 was trained. Other inputs can include data such transmission electron microscope data or use OCD data (e.g., scatterometry OCD metrology) 1831 on features such as trench CD profiles, which can be a one-time, general measurement for a device. These inputs are then used by the correlation model 1821 to fit, in this example, the memory hole CD value for each word line to match the die sort word line RC data to generate the output 1835 for the memory hole CD profile.

Consequently, as illustrated in FIG. 18, the virtual methodology approach to modelling and prediction allows for creation of a correlation model based on one or more of inline, die sort, and EDR and design inputs automatically. EDR and design inputs can be fixed for a given technology and the inline and die sort inputs can be used to create a unique model parameter for a batch of lots. In the example embodiment, this can provide die level memory hole profile through the correlation model and the inputs of die sort word line RC values from all of the tested word lines.

Figure 19:
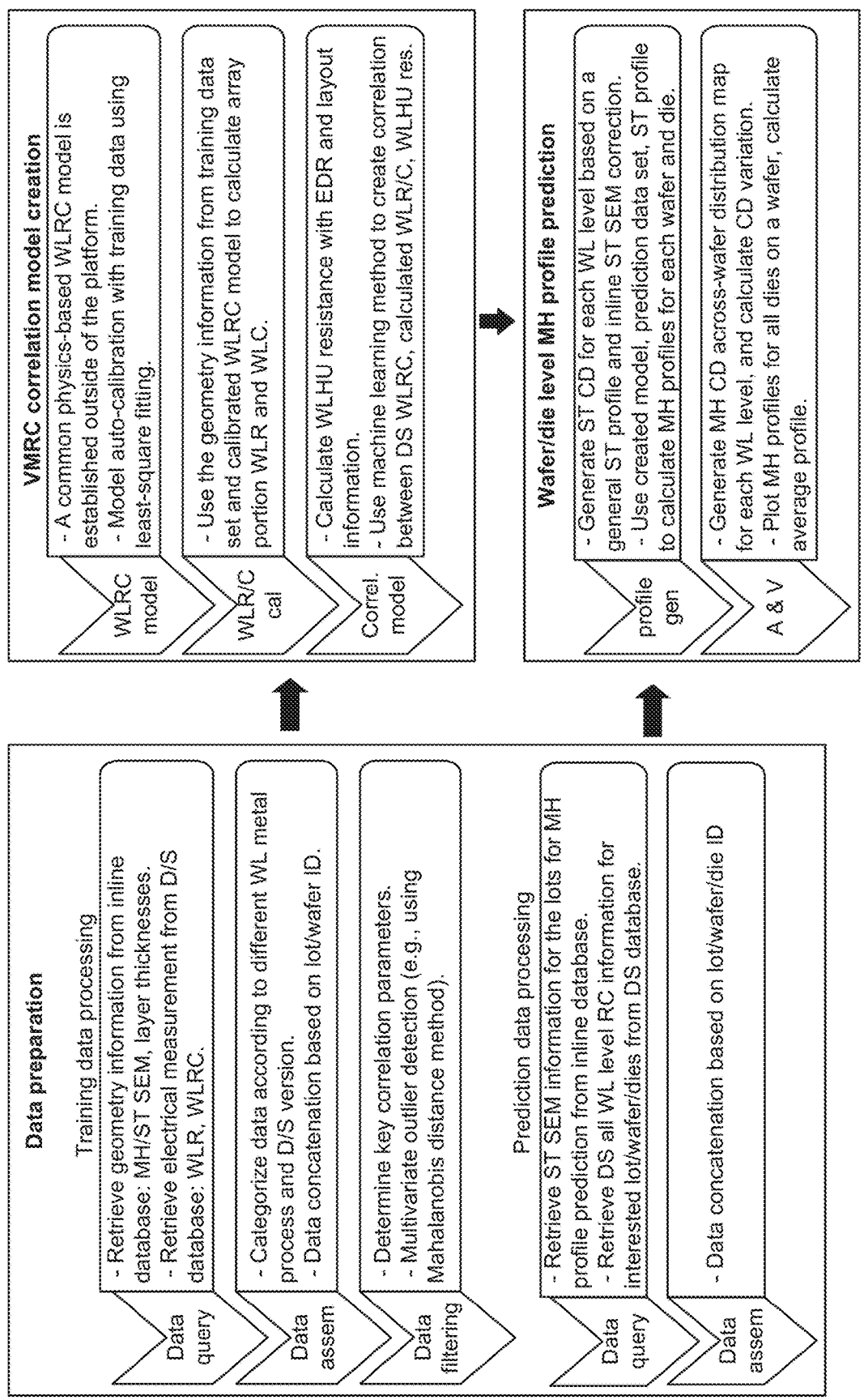
FIG. 19 is a virtual metrology platform diagram for an embodiment based on word line RC values.

FIG. 19 is a virtual metrology platform diagram for an embodiment based on word line RC values, where the testing and processing facilities can again be as described above with respect FIG. 13C, although the inline and die sort data can now include the examples discussed here (e.g., word line RC data from die sort testing). The data preparation process has a training data processing component, that can include a data query, data assembly, and data filtering and a prediction data processing component, that can include data query and data assembly. The data query for the training data processing can include retrieving geometry information from an inline database, such as memory hole (MEI) and silica trench (ST) SEM data and optical CD data such as thicknesses of the circuitry structure's layers. The data query for the training data processing can also include retrieving electrical measurement from a die sort database, such as word line resistance and RC values. Data assembly in the training data processing can include categorizing data according to different word line metal processing and the version of die sort testing used and performing a data concatenation based on processing lot/wafer IDs. The data filtering can determine key correlation parameters and perform multivariate outlier detection, such as by using a Mahalanobis distance method, for example.

With respect to the prediction data processing, in the data query phase trench SEM information is retrieved for the lots for memory profile prediction from inline database, corresponding to 1831 of FIG. 18, and the die sort data for all word line level RC information is retrieved for interested lot/wafer/dies from a die sort database, corresponding to 1833 of FIG. 18. At data assembly, data concatenation is performed based on lot/wafer/die ID.

Once the training data has been processed, it can be used in the creation of the virtual methodology RC correlation model, corresponding to 1821 of FIG. 18. The model creation includes a word line RC model, an array word line resistance/capacitance calibration, and determination of a correlation model. The word line RC model can be a physics-based word line RC model that is established outside of the platform. As this process uses an analytical model, it is not software dependent. Auto-calibration with training data can be modelled using, for example, least-square fitting. The array word line resistance and capacitance correlation process can use the geometry information from training data set and calibrated word line RC model to calculate array portion word line resistance and word line capacitance. To construct the correlation model, the word line hook-up resistance can be calculated from EDR and layout information, where this can be a one time operation for a given technology, independent of training data set. Machine learning can then be used to create correlations between die sort RC data, calculated word line resistance and capacitance values, and word line hook-up resistance values. As described above, the machine learning can be based on one or more techniques such as generalized liner models (GLM) including lasso regulation, random forest models, gradient boosting machine (GBM) models, and neural networks.

Once a correlation model is created, this can be used with the concatenated data assembled in the prediction data processing for wafer/die level memory hole profile prediction. In a profile prediction phase, silica trench CD for each word line can be generated based on a general silica trench profile and inline silica trench SEM correction. The created virtual metrology RC model, prediction data set, and silica trench profile are then used to calculate MH profiles for each wafer and die. Analysis and visualization (A & V) then follows, where this can include generating memory hole CD across-wafer distribution map for each word line level, calculating CD variation, plotting memory hole profiles for all dies on a wafer, and calculating average profile.

Considering some of the components or modules of FIG. 19 in more detail, with respect to the word line RC model calibration, the word line RC model can be a physics-based model established based on technology computer-aided design (TCAD) learnings, which can incorporate effects such as current from word lines seeping through memory holes, fringing field effects between word lines and surrounding layers, and other effects that can be properly included. Within word line RC model input parameters, geometry information can be obtained from an inline database. The word line resistivity information depends on process used for word line metal and can be automatically extracted based on each inline geometry/die sort word line resistance data set.

Figure 20:
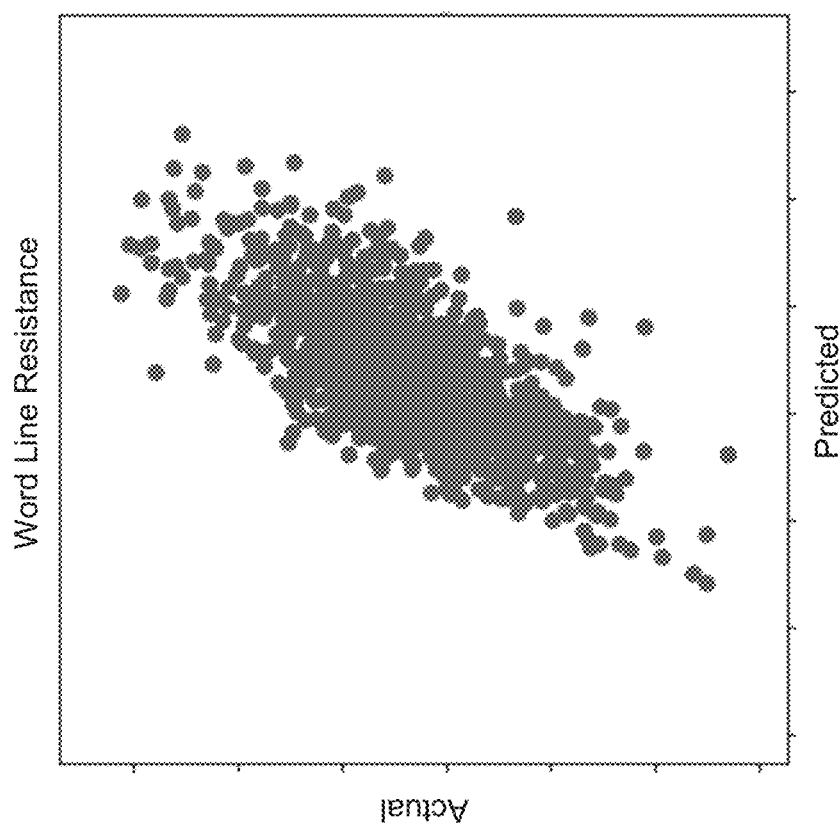
FIG. 20 is a plot of the predicted versus actual word line resistance values that can be used in model auto-calibration.

With respect to auto-calibration of the word line RC model, the word line resistance can be calculated based on the word line RC model with geometry inputs from inline testing. Least square fitting can then be used to search for the best word line resistivity model formula and parameter values based on the predicted versus actual word line resistance, such as illustrated in FIG. 20, in order to have calculated word line resistance matching to the die sort testing measured word line resistance. In this way, the resistivity parameters can be automatically calibrated.

Figure 21:
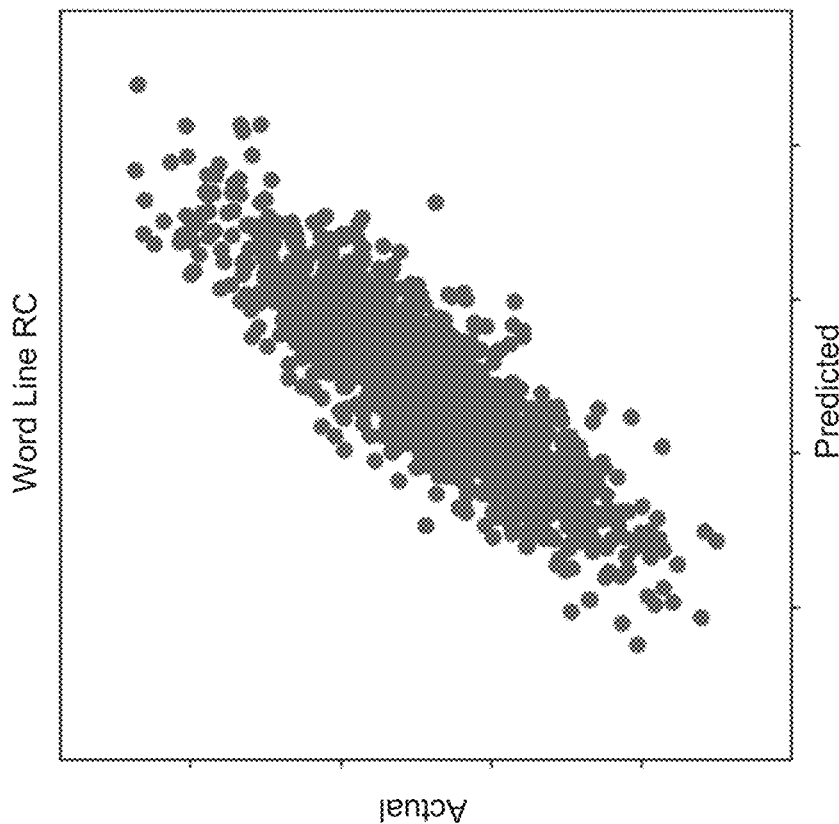
FIG. 21 illustrates an example to show predicted total word line RC values versus die sort measured word line RC values.

With respect to virtual metrology RC model creation, the die sort measured word line RC values can be determined based on number of counts of clock numbers needed to rise a word line signal to certain voltage. It includes the contribution from array properties such as word line resistance, word line capacitance, word line hook-up resistance (including contributions such as wiring resistance, transistor resistance, etc.), and system shift. The machine learning method is used here to create correlation between die sort measured word line RC, calculated array portion word line resistance and capacitance component, and word line hook-up resistance. FIG. 21 illustrates an example to show predicted total word line RC versus die sort measured word line RC values, showing good correlation of R2~0.73.

As noted above, one of several machine learning model techniques, or a combination of such techniques, can be applied depending on the embodiment, including: deep neural networks; distributed random forest, extremely randomized trees; generalized linear regression models; and/or gradient boosting machine. The results from the different techniques can have different levels of accuracy and relative advantages. For example, generalized linear regression models might provide good correlation between layers but with a relatively large difference between predicted and actual values, while a gradient boosted machine may have poorer correlation of each layer but with a smaller difference between predicted and actual values.

Figure 22:
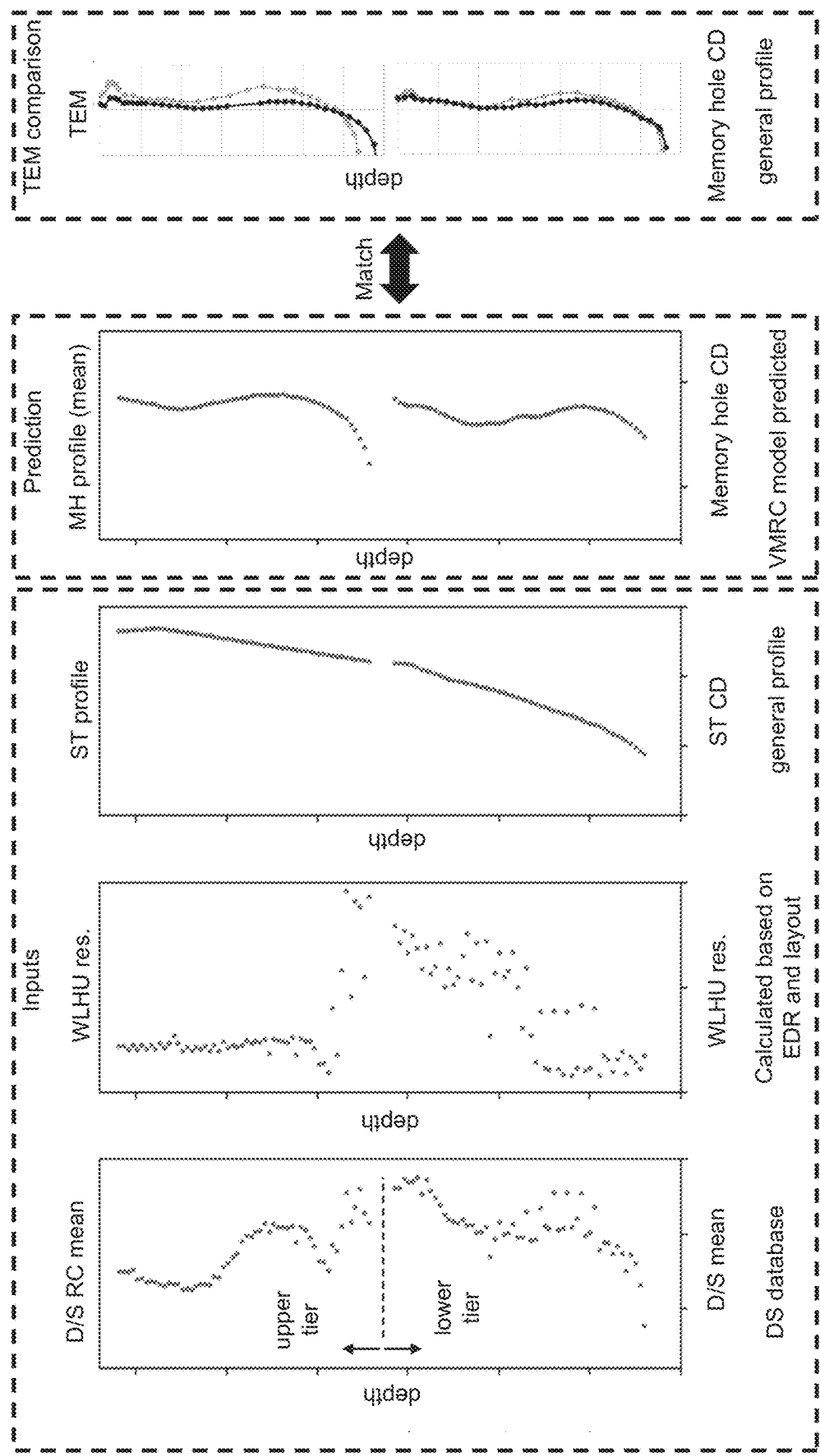
FIG. 22 illustrates inputs, predictions, and, for comparison, actual data for virtual metrology RC prediction of wafer level average memory hole profiles.

FIG. 22 illustrates inputs, predictions, and, for comparison, actual data for virtual metrology RC prediction of wafer level average memory hole profiles for a circuit structure such as illustrated in FIG. 2. The vertical axis in each of the individual figures is the depth into the structure and includes data for the upper tier of the memory holes (though layers above the joint region circled at 203) and the lower tier of the memory holes (through layers below the joint region circled at 203). The inputs in this embodiment include the mean die sort RC values from the die sort database, the word line hook-up resistance values calculated based on EDR and layout, and the general profile of the silica trenches from optical CD data. From these inputs, the virtual RC model can predict a mean memory hole CD profile as illustrated to the right of the inputs. For comparison, at far right is actual transmission electron microscope (TEM) and/or OCD data for memory hole CD values obtained by cutting wafer samples. As illustrated, the memory hole CD values predicted by the model match the actual TEM and/or OCD data well.

Figure 23:
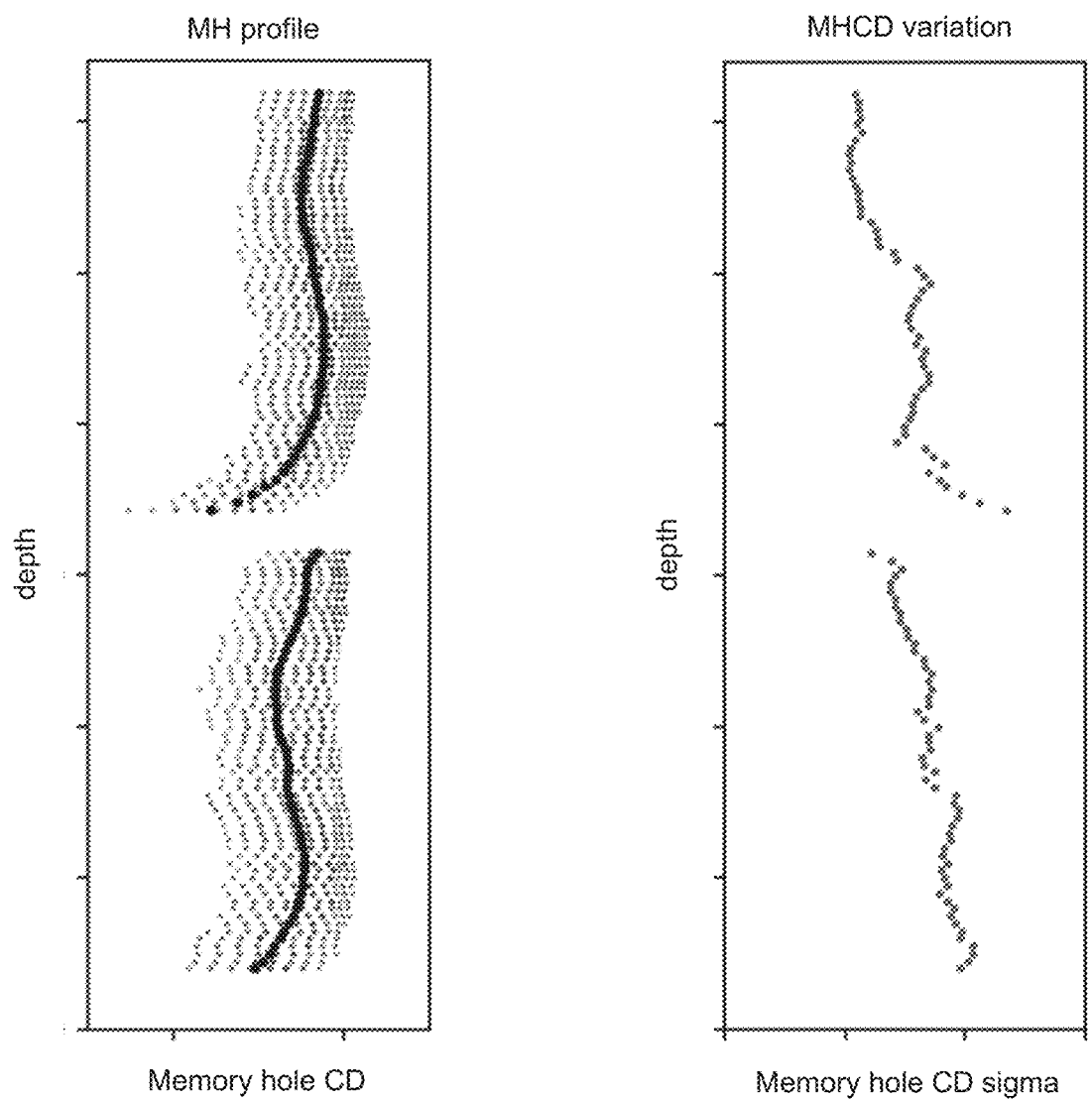
FIG. 23 illustrates die level memory hole profile data from virtual metrology RC prediction.

FIG. 23 illustrates die level memory hole profile data from virtual metrology RC prediction. At left, the memory holes profiles for all dies on a wafer are plotted as memory hole CD versus depth to show the overall shape. At right the memory hole CD variation for each word line level is calculated as the sigma values of the memory hole CD values versus depth.

Figure 24:
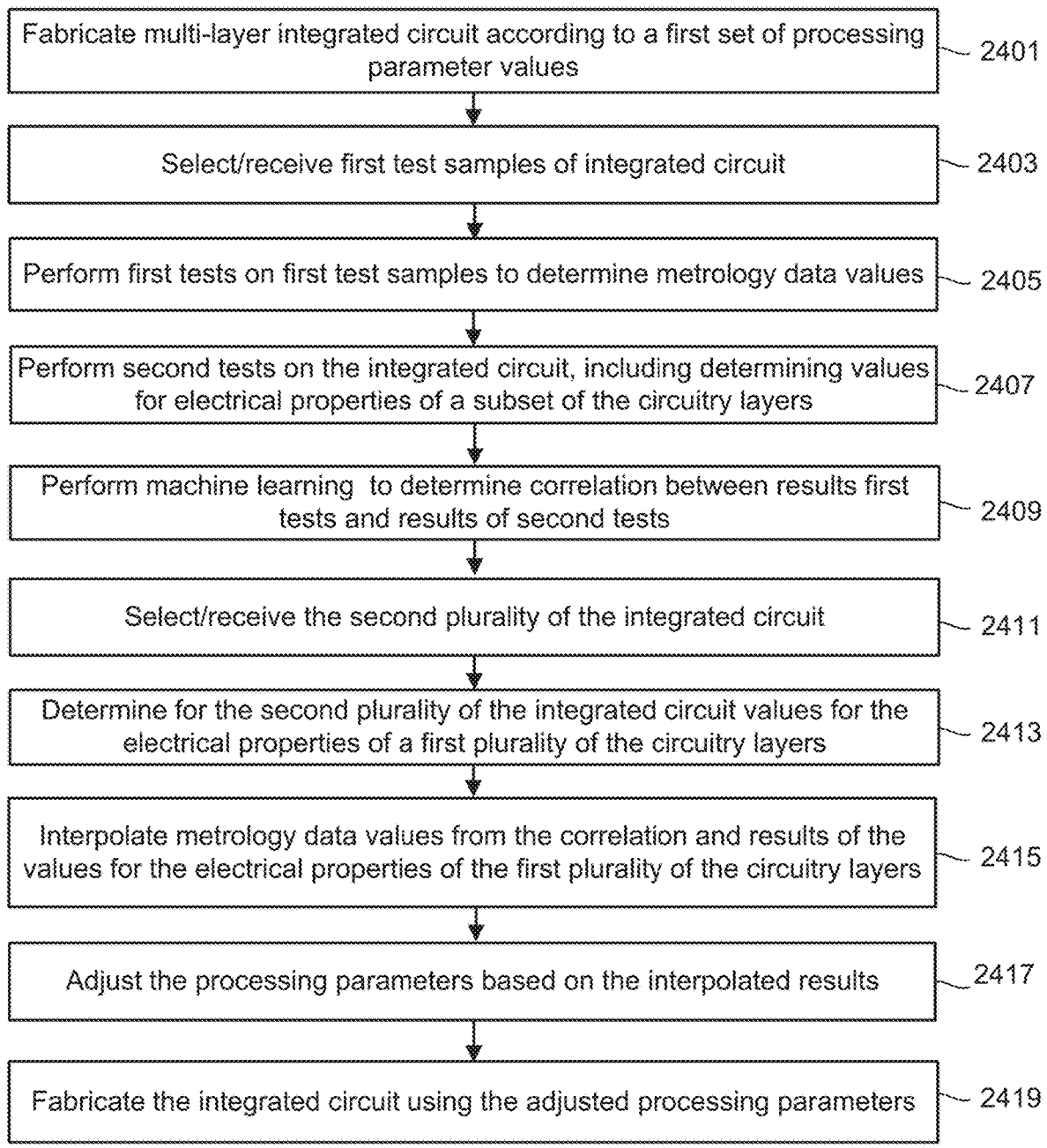
FIG. 24 is a flowchart for an embodiment of the virtual metrology techniques described with respect to FIGS. 18-23.

FIG. 24 is a flowchart for an embodiment of the virtual metrology techniques described above with respect to FIGS. 18-23. The flow of FIG. 24 is similar to that of FIGS. 16 and 17 and can again be performed in the context of FIG. 13, but where the tests and data are now for the generation of a virtual metrology based on the electrical properties of the layers of a multi-later circuit structure, such as, for example, determining memory hole profiles of a 3D memory circuit based on word line RC values. Beginning at step 2401, integrated circuits having multiple layers of circuitry, such as the 3D NAND memory example, are fabricated according to a set of processing parameters at a fabrication facility 1391.

The test samples for the integrated circuit are selected or received at step 2403 and one or more first tests are performed on the test sample to determine corresponding metrology data values for the test samples at step 2405. The tests at step 2405 can include one or more of inline testing at the fabrication facility, die sort testing at the die sort facility 1393 (which may or may not be at the same location as the fabrication facility 1391), or other testing and testing locations, such as backend testing. Examples of such tests can include SEM CD data, optical CD data, and TEM data, as described above with respect to FIGS. 18 and 19. A second set of tests are performed on the samples at step 2407, where these second tests include determining values for electrical properties of a subset of the circuitry layers for test samples. In the example embodiment, these tests can be die sort testing to determine word line RC values of selected layers by applying a voltage to the word lines and determine the time for voltage level on the word line to reach a specified voltage level in response.

The results of the first tests and second tests can then supplied to the processing facility 1397 to performing a machine learning process at step 2409 to determine a correlation between the metrology data values and results of the second tests, as described with respect to FIGS. 18 and 19. This process can also include physics-based models for features such as word line RC values. The processing at the processing facility 1397 can be as described above with respect to FIG. 13C and can also include selection of the machine learning model used. Once the machine learning process determines the correlation between metrology (e.g., features such memory hole profiles) and the electrical properties of the layers (e.g., word line RC values), the virtual metrology can be applied to other examples of the integrated circuit. The additional examples are received at step 2411 and at step 2413 values for the electrical properties of a first plurality of the circuitry layers, such as word line RC values for all of the word lines of all layers being determined at the die sort facility 1393. The data from step 2415 can be provided to the processing facility 1397, where at step 2415 metrology data values can be interpolated for the circuitry layers of the second plurality of the integrated circuit from the correlation and results of the values for the electrical properties of the first plurality of the circuitry layers. Based on the interpolated metrology data values from step 2415, at step 2417 the processing parameters for the integrated circuit can be adjusted and provided to the fabrication facility 1391. At step 2419, the integrated circuit can then be fabricated using the adjusted processing parameters.

As described above, the virtual metrology RC approach can provide a fast virtual metrology method (e.g., minutes) for physical dimension measurement compared to traditional TEM methods (e.g., days). This approach is able to use existing limited inline data and rich die sort word line RC data to predict entire memory hole profiles at each word line level for each wafer and each die. This allows further die sort yield/reliability analysis for all dies. The virtual metrology RC prediction can be automated without engineer interaction and the model build is independent of the die sort version used, such that it need not be rebuilt for each one.

In a first set of embodiments, a method includes receiving a first plurality of an integrated circuit as first test samples, the integrated circuit comprising a plurality of circuitry layers formed on a substrate, performing one or more first tests on the first test samples to determine a corresponding one or more metrology data values for each of the first test samples, and performing one or more second tests on the first plurality of the integrated circuit, the one or more second test including determining values for electrical properties of a first subset of the circuitry layers. A machine learning process is performed to determine a correlation between the metrology data values and results of the one or more second tests. The method also includes receiving a second plurality of the integrated circuit; determining, for the second plurality of the integrated circuit, values for the electrical properties of a first plurality of the circuitry layers, the first plurality of the circuitry layers including circuitry layers other than the first subset of the circuitry layers; and interpolating metrology data values for the first plurality of the circuitry layers of the second plurality of the integrated circuit from the correlation and results of the values for the electrical properties of the first plurality of the circuitry layers.

In further embodiments, a method includes fabricating a plurality of an integrated circuit using a first set of processing parameters, the integrated circuit comprising a plurality of circuitry layers formed on a substrate. The method also includes: selecting a first plurality of the integrated circuit as first test samples; performing one or more first tests on the first test samples to determine a corresponding one or more metrology data values for each of the first test samples; performing one or more second tests on the first plurality of the integrated circuit, the one or more second tests including determining values for electrical properties of a first subset of the circuitry layers; performing a machine learning process to determine a correlation between the metrology data values and results of the one or more second tests; selecting a second plurality of the integrated circuit; determining, for the second plurality of the integrated circuit, values for the electrical properties of a first plurality of the circuitry layers, the first plurality of the circuitry layers including circuitry layers other than the first subset of the circuitry layers; and interpolating metrology data values for the first plurality of the circuitry layers of the second plurality of the integrated circuit from the correlation and results of the values for the electrical properties of the first plurality of the circuitry layers. Based the interpolated metrology data values, the processing parameters are adjusted and the integrated circuit is fabricated using the adjusted processing parameters.

In additional embodiments, a system includes one or more processors. The one or more processors are configured to: receive results of one or more first tests on a plurality of first test samples from a first plurality of an integrated circuit, the integrated circuit comprising a plurality of circuitry layers formed on a substrate; determine from the one or more first tests a corresponding one or more metrology data values for each of the first test samples; receive results of one or more second tests on the first test samples of the integrated circuit, the one or more second tests including determining values for electrical properties of a first subset of the circuitry layers; perform a machine learning process to determine a correlation between the metrology data values and results of the one or more second tests; receive, for a second plurality of the integrated circuit, values for the electrical properties of a first plurality of the circuitry layers, the first plurality of the circuitry layers including circuitry layers other than the first subset of the circuitry layers; and interpolate metrology data values for the first plurality of the circuitry layers of the second plurality of the integrated circuit from the correlation and results of the values for the electrical properties of the first plurality of the circuitry layers.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. h It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method, comprising:
    receiving a first plurality of an integrated circuit as first test samples, the integrated circuit comprising a plurality of circuitry layers formed on a substrate;
    performing one or more first tests on the first test samples to determine a corresponding one or more metrology data values for each of the first test samples;
    performing one or more second tests on the first plurality of the integrated circuit, the one or more second tests including determining values for electrical properties of a first subset of the circuitry layers;
    performing a machine learning process to determine a correlation between the metrology data values and results of the one or more second tests;
    receiving a second plurality of the integrated circuit;
    determining, for the second plurality of the integrated circuit, values for the electrical properties of a first plurality of the circuitry layers, the first plurality of the circuitry layers including circuitry layers other than the first subset of the circuitry layers; and
    interpolating metrology data values for the first plurality of the circuitry layers of the second plurality of the integrated circuit from the correlation and results of the values for the electrical properties of the first plurality of the circuitry layers.

2. The method of claim 1, wherein the plurality of circuitry layers include a plurality of layers of word lines and the electrical properties of the circuitry layers comprise electrical properties of the word lines.

3. The method of claim 2, wherein the electrical properties of the word lines include resistance-capacitance (RC) values for the word lines.

4. The method of claim 3, wherein determining the RC values for the electrical properties of the word lines of the circuitry layers comprises:
applying a voltage to each of the word lines; and
determining for each of the word lines a time for voltage level on the word line to reach a specified voltage level in response to the application of the voltage.

5. The method of claim 2, wherein determining for the second plurality of the integrated circuit values for the electrical properties of the first plurality of the circuitry layers includes determining electrical properties of all of the word lines of all of the layers of word lines.

6. The method of claim 2, wherein the integrated circuit further comprises a plurality of memory holes extending vertically through layers of word lines, and
wherein the interpolated metrology for the first plurality of the circuitry layers of the second plurality of the integrated circuit includes profiled for the memory holes.

7. The method of claim 1, wherein determining for the second plurality of the integrated circuit values for the electrical properties of the first plurality of the circuitry layers is performed as part of a die sort process.

8. The method of claim 1, wherein one or more of the first tests are performed as part of a die sort test process.

9. The method of claim 1, wherein one or more of the first tests are performed as part of an inline test process during fabrication of the first test samples.

10. The method of claim 1, wherein one or more of the second tests are performed as part of a die sort test process.

11. The method of claim 1, wherein one or more of the second tests are performed as part of an inline test process during fabrication of the first test samples.

12. The method of claim 1, further comprising:
receiving a model of the electrical properties of the integrated circuit, wherein the machine learning process uses the model in determining the correlation between the metrology data values and results of the one or more second tests.

13. The method of claim 1, wherein one or more of the first tests include:
determining critical dimension data by an electron microscope.

14. The method of claim 1, wherein one or more of the first tests include:
determining optical critical dimension data.

15. The method of claim 14, wherein the integrated circuit further comprises one or more trenches extending vertically through layers of the integrated circuit and the optical critical dimension data includes critical dimension data for the trenches.

16. The method of claim 1, wherein performing the machine learning process comprises:
selecting a machine learning model.

17. The method of claim 1, wherein receiving the first plurality of the integrated circuit and receiving the second plurality of the integrated circuit respectively comprise fabricating the first plurality of the integrated circuit and fabricating the second plurality of the integrated circuit.

18. The method of claim 17, wherein the first plurality of the integrated circuit and the second plurality of the integrated circuit are fabricated using a first set of processing parameters and the method further comprises:
based the interpolated metrology data values, adjusting the first set of processing parameters; and
fabricating the integrated circuit using the adjusted first set of processing parameters.

19. A method, comprising:
fabricating a plurality of an integrated circuit using a first set of processing parameters, the integrated circuit comprising a plurality of circuitry layers formed on a substrate;
selecting a first plurality of the integrated circuit as first test samples;
performing one or more first tests on the first test samples to determine a corresponding one or more metrology data values for each of the first test samples;
performing one or more second tests on the first plurality of the integrated circuit, the one or more second tests including determining values for electrical properties of a first subset of the circuitry layers;
performing a machine learning process to determine a correlation between the metrology data values and results of the one or more second tests;
selecting a second plurality of the integrated circuit;
determining, for the second plurality of the integrated circuit, values for the electrical properties of a first plurality of the circuitry layers, the first plurality of the circuitry layers including circuitry layers other than the first subset of the circuitry layers;
interpolating metrology data values for the first plurality of the circuitry layers of the second plurality of the integrated circuit from the correlation and results of the values for the electrical properties of the first plurality of the circuitry layers;
based the interpolated metrology data values, adjusting the processing parameters; and
fabricating the integrated circuit using the adjusted processing parameters.

20. A system, comprising:
one or more processors, the one or more processors configured to:
receive results of one or more first tests on a plurality of first test samples from a first plurality of an integrated circuit, the integrated circuit comprising a plurality of circuitry layers formed on a substrate;
determine from the one or more first tests a corresponding one or more metrology data values for each of the first test samples;
receive results of one or more second tests on the first test samples of the integrated circuit, the one or more second tests including determining values for electrical properties of a first subset of the circuitry layers;
perform a machine learning process to determine a correlation between the metrology data values and results of the one or more second tests;
receive, for a second plurality of the integrated circuit, values for the electrical properties of a first plurality of the circuitry layers, the first plurality of the circuitry layers including circuitry layers other than the first subset of the circuitry layers; and
interpolate metrology data values for the first plurality of the circuitry layers of the second plurality of the integrated circuit from the correlation and results of the values for the electrical properties of the first plurality of the circuitry layers.

* * * * *